(12) United States Patent
Komatsu

(10) Patent No.: US 11,838,007 B2
(45) Date of Patent: Dec. 5, 2023

(54) MULTIPLEXER INCLUDING ACOUSTIC WAVE FILTER WITH TRANSMISSION LINE BETWEEN RESONATORS

(71) Applicant: Skyworks Solutions, Inc., Irvine, CA (US)

(72) Inventor: Tomoya Komatsu, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 260 days.

(21) Appl. No.: 17/130,558

(22) Filed: Dec. 22, 2020

(65) Prior Publication Data

US 2021/0111705 A1   Apr. 15, 2021

Related U.S. Application Data

(63) Continuation of application No. 16/988,417, filed on Aug. 7, 2020, now Pat. No. 11,411,552.

(60) Provisional application No. 62/884,619, filed on Aug. 8, 2019, provisional application No. 62/884,621, filed on Aug. 8, 2019.

(51) Int. Cl.
*H03H 9/72* (2006.01)
*H03H 9/56* (2006.01)
*H03H 9/70* (2006.01)
*H03F 3/19* (2006.01)
*H04B 1/40* (2015.01)
*H03H 9/64* (2006.01)

(52) U.S. Cl.
CPC ............... *H03H 9/72* (2013.01); *H03F 3/19* (2013.01); *H03H 9/568* (2013.01); *H03H 9/6483* (2013.01); *H03H 9/703* (2013.01); *H04B 1/40* (2013.01); *H03F 2200/294* (2013.01); *H03F 2200/451* (2013.01)

(58) Field of Classification Search
CPC ........ H03H 9/72; H03H 9/568; H03H 9/6483; H03H 9/703; H03H 9/725; H03H 9/706; H03F 3/19; H03F 2200/294; H03F 2200/451; H03F 1/56; H03F 2200/111; H03F 3/195; H03F 3/72; H03F 2203/7209
USPC .......................................................... 455/73
See application file for complete search history.

(56) References Cited

U.S. PATENT DOCUMENTS

| 6,424,238 | B1 | 7/2002 | Penunuri |
| 7,164,306 | B2 | 1/2007 | Makino |
| 7,409,200 | B2 | 8/2008 | Derbyshire et al. |
| 8,193,877 | B2 | 6/2012 | Fritz et al. |
| 9,077,311 | B2 | 7/2015 | Yan et al. |
| 9,231,557 | B2 | 1/2016 | Umeda et al. |

(Continued)

*Primary Examiner* — Eugene Yun
(74) *Attorney, Agent, or Firm* — Knobbe, Martens, Olson & Bear, LLP

(57) ABSTRACT

Aspects of this disclosure relate to a multiplexer that includes an acoustic wave filter including acoustic wave resonators on at least two die with a transmission line electrically connecting the acoustic wave resonators on the two die. The acoustic wave filter can include a plurality of acoustic wave resonators on a first die electrically connected to at least one acoustic wave resonator on a second die via the transmission line. The acoustic wave resonator on the second die can provide a relatively high impedance at a respective passband of one or more other filters of the multiplexer. This can reduce effects of the transmission line of the acoustic wave filter on a respective passband of one or more other filters of the multiplexer.

20 Claims, 19 Drawing Sheets

(56) References Cited

U.S. PATENT DOCUMENTS

| | | |
|---|---|---|
| 10,367,475 B2 | 7/2019 | Caron |
| 10,541,673 B2 | 1/2020 | Caron |
| 11,411,552 B2 | 8/2022 | Komatsu |
| 2012/0086524 A1* | 4/2012 | Komura ................. H03H 9/725 |
| | | 333/195 |
| 2018/0048292 A1 | 2/2018 | Hey-Shipton |
| 2019/0319605 A1 | 10/2019 | Ando et al. |
| 2019/0319606 A1 | 10/2019 | Ando et al. |
| 2019/0319772 A1 | 10/2019 | Ando et al. |
| 2019/0334563 A1* | 10/2019 | Elbrecht .............. H04B 1/0057 |
| 2020/0228100 A1 | 7/2020 | Caron |
| 2021/0058069 A1 | 2/2021 | Komatsu |
| 2021/0111705 A1 | 4/2021 | Komatsu |

* cited by examiner

MULTIPLEXER INCLUDING ACOUSTIC WAVE FILTER WITH TRANSMISSION LINE BETWEEN RESONATORS

CROSS-REFERENCE TO RELATED APPLICATION

Any and all applications for which a foreign or domestic priority claim is identified in the Application Data Sheet, or any correction thereto, are hereby incorporated by reference under 37 CFR 1.57.

BACKGROUND

Technical Field

Embodiments of this disclosure relate to acoustic wave filters.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. In BAW resonators, acoustic waves propagate in a bulk of a piezoelectric layer. Example BAW resonators include film bulk acoustic wave resonators (FBARs) and solidly mounted resonators (SMRs).

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, three acoustic wave filters can be arranged as a triplexer.

In multiplexers, acoustic wave filters can be implemented by a plurality of die. Maintaining low insertion loss and a high reflection coefficient for an acoustic wave filter of a multiplexer that includes a plurality of die can be difficult to achieve.

SUMMARY

The innovations described in the claims each have several aspects, no single one of which is solely responsible for its desirable attributes. Without limiting the scope of the claims, some prominent features of this disclosure will now be briefly described.

One aspect of this disclosure is a multiplexer for filtering radio frequency signals. The multiplexer includes a multi-die acoustic wave filter and an acoustic wave filter coupled to the multi-die acoustic wave filter at a common node. The multi-die acoustic wave filter includes a first acoustic resonator on a first die and a second acoustic resonator on a second die. The first acoustic resonator is electrically connected to the second acoustic resonator via a transmission line. The first acoustic resonator is electrically connected to the common node via the transmission line. The acoustic wave filter includes a plurality of series acoustic resonators and a plurality of shunt acoustic resonators on the second die.

The multiplexer can further include an additional acoustic wave filter coupled to the common node. The additional acoustic wave filter can include a third acoustic resonator on the second die. The additional acoustic wave filter can further include a fourth acoustic resonator on a third die. The third acoustic resonator can be coupled to the fourth acoustic resonator via a second transmission line.

The multiplexer can include a switch coupled between the second acoustic resonator and the common node. Alternatively, the second acoustic resonator can be coupled to the common node without an intervening switch. The common node can be on the second die.

All acoustic resonators of the acoustic wave filter can be on the second die.

The first acoustic resonator can be a series resonator and the second acoustic resonator can be a shunt resonator. Alternatively, the first acoustic resonator can be a shunt resonator and the second acoustic resonator can be a series resonator.

The multi-die acoustic wave filter can further include a third acoustic resonator on the second die, in which the second acoustic resonator is series resonator and the third acoustic resonator is shunt resonator.

The first acoustic resonator can be a surface acoustic wave resonator. Alternatively, the first acoustic resonator can be a bulk acoustic wave resonator.

The first acoustic resonator and the second acoustic resonator can be the same type of acoustic resonator. The first acoustic resonator and the second acoustic resonator can be surface acoustic wave resonators. The first acoustic resonator and the second acoustic resonator can be bulk acoustic wave resonators.

The first acoustic resonator can be coupled to the common node via the second acoustic resonator. The second acoustic resonator can be a surface acoustic wave resonator.

Another aspect of this disclosure is a multi-chip module that includes a multiplexer and a radio frequency amplifier die. The multiplexer includes a first filter and a second filter coupled to the first filter at a common node. The first acoustic wave filter includes a first acoustic resonator on a first die and a second acoustic resonator on a second die. The first acoustic resonator is electrically connected to the second acoustic resonator via a transmission line. The first acoustic resonator is electrically connected to the common node via the transmission line. The second filter includes a plurality of series acoustic resonators and a plurality of shunt acoustic resonators on the second die. The first die and the second die are positioned on a substrate. The radio frequency amplifier die is positioned on the substrate. The radio frequency amplifier die includes a radio frequency amplifier operatively coupled to the first filter.

The radio frequency amplifier can be a low noise amplifier. The radio frequency amplifier die can further include a second low noise amplifier operatively coupled to the second filter. A switch can selectively couple the first filter to the low noise amplifier and to selectively couple the second filter to the low noise amplifier. The multi-chip module can include a power amplifier operatively coupled to the second filter.

The radio frequency amplifier can be a power amplifier.

The multiplexer can include one or more additional features of the multiplexer disclosed herein.

Another aspect of this disclosure is a wireless communication device that includes a multiplexer, an antenna, a radio frequency amplifier, and a transceiver in communication with the radio frequency amplifier. The multiplexer includes a first filter and a second filter coupled to the first filter at a common node. The first acoustic wave filter includes a first acoustic resonator on a first die and a second acoustic resonator on a second die. The first acoustic resonator is electrically connected to the second acoustic resonator via a transmission line. The first acoustic resonator is electrically connected to the common node via the transmission line. The second filter includes a plurality of series acoustic resonators and a plurality of shunt acoustic resonators on the second die. The antenna is operatively coupled to the common node. The radio frequency amplifier is operatively coupled to the first filter. The radio frequency amplifier is configured to amplify a radio frequency signal.

The wireless communication device can further include a baseband processor in communication with the transceiver. The wireless communication device can further include one or more additional features of any of the multiplexers and/or the multi-chip modules disclosed herein.

The multiplexer can be included in a radio frequency front end. The multiplexer can be included in a diversity receive module.

Another aspect of this disclosure is a method of filtering a radio frequency signal. The method includes receiving a radio frequency signal at an input port of a first acoustic wave filter of a multiplexer in accordance with any suitable principles and advantages disclosed herein. The method includes filtering the radio frequency signal with the first acoustic wave filter.

Another aspect of this disclosure is a multiplexer for filtering radio frequency signals. The multiplexer includes a multi-die acoustic wave filter and an acoustic wave filter coupled to the multi-die acoustic wave filter at a common node. The multi-die acoustic wave filter includes a first acoustic resonator on a first die and a second acoustic resonator on a second die. The first acoustic resonator is electrically connected to the second acoustic resonator via a transmission line. The first acoustic resonator is electrically connected to the common node via the transmission line. The acoustic wave filter includes a plurality of series acoustic resonators and a shunt acoustic resonator on the second die.

Another aspect of this disclosure is a multiplexer for filtering radio frequency signals. The multiplexer includes a multi-die acoustic wave filter and an acoustic wave filter coupled to the multi-die acoustic wave filter at a common node. The multi-die acoustic wave filter includes a first acoustic resonator on a first die and a second acoustic resonator on a second die. The first acoustic resonator is electrically connected to the second acoustic resonator via a transmission line. The first acoustic resonator is electrically connected to the common node via the transmission line. The acoustic wave filter includes a series acoustic resonator and a plurality of shunt acoustic resonators on the second die.

Another aspect of this disclosure is a multiplexer for filtering radio frequency signals. The multiplexer includes a first acoustic wave filter and a second acoustic wave filter. The first acoustic wave filter includes a first acoustic resonator on a first die and a second acoustic resonator on a second die. The second acoustic resonator is electrically connected to the first acoustic resonator via a transmission line. The first acoustic resonator is the same type of acoustic resonator as the second acoustic resonator. The second acoustic wave filter is coupled to the first acoustic wave filter at a common node.

The first acoustic resonator and the second acoustic resonator can be surface acoustic wave resonators. Alternatively or additionally, the first acoustic resonator and the second acoustic resonator can be bulk acoustic wave resonators.

The second acoustic wave filter can include a third acoustic resonator on the second die. The second acoustic wave filter can include a fourth acoustic resonator on a third die, in which the third acoustic resonator coupled to the fourth acoustic resonator via a second transmission line. The second acoustic resonator and the third acoustic resonator can be electrically connected to each other on the second die.

The multiplexer can include a switch coupled between the first acoustic wave filter and the common node. The switch can also be coupled between the second acoustic wave filter and the common node.

The first acoustic wave filter can be coupled to the common node without an intervening switch.

The common node can be on the second die.

The first acoustic resonator and the second acoustic resonator can be series resonators. Alternatively, the first acoustic resonator and the second acoustic resonator can be shunt resonators.

The first acoustic wave filter can further include a third acoustic resonator on the second die, in which the second acoustic resonator is a series resonator, and in which the third acoustic resonator is a shunt resonator.

The multiplexer can further include a third acoustic wave filter coupled to the common node. The second acoustic wave filter can include a third acoustic resonator on the second die. The third acoustic wave filter can include a fourth acoustic resonator on the second die. All acoustic resonators of the third acoustic wave filter can be on the second die. The second acoustic wave filter can include another acoustic resonator on a third die.

Another aspect of this disclosure is a multiplexer for filtering radio frequency signals. The multiplexer includes a first acoustic wave filter and a second acoustic wave filter. The first acoustic wave filter includes a plurality of bulk acoustic wave resonators on a first die and a first surface acoustic wave resonator on a second die. The plurality of bulk wave resonators is electrically connected to the first surface acoustic wave resonator and a common node via a transmission line. The second acoustic wave filter is coupled to the first acoustic wave filter at the common node. The second acoustic wave filter includes a second surface acoustic wave resonator on the second die.

The second acoustic wave filter can include another acoustic resonator on a third die, in which the second surface acoustic wave resonator is coupled to the another acoustic resonator via a second transmission line.

The multiplexer can include a switch coupled between the first acoustic wave filter and the common node. The switch can also be coupled between the second acoustic wave filter and the common node.

The first acoustic wave filter can be coupled to the common node without an intervening switch.

The common node can be on the second die.

The first surface acoustic wave resonator can be a series resonator. The second surface acoustic wave resonator can be a series resonator.

The first surface acoustic wave resonator can be a shunt resonator. The second surface acoustic wave resonator can be a shunt resonator.

The first acoustic wave filter can include another surface acoustic wave resonator on the second die.

The multiplexer can include a third acoustic wave filter coupled to the common node. The third acoustic wave filter can include a third surface acoustic wave resonator on the second die. The second surface acoustic wave resonator and the third surface acoustic wave can be electrically connected to each other on the second die. All acoustic resonators of the third acoustic wave filter can be on the second die. The second acoustic wave filter can include another acoustic resonator on a third die.

The first surface acoustic wave resonator can be a temperature compensated surface acoustic wave resonator. The second surface acoustic wave resonator can be a temperature compensated surface acoustic wave resonator.

Another aspect of this disclosure is a multi-chip module that includes a multiplexer in accordance with any suitable principles and advantages disclosed herein and a radio frequency amplifier die. The multiplexer includes a multi-die acoustic wave filter on a substrate. The radio frequency amplifier die is positioned on the substrate. The radio frequency amplifier die includes a radio frequency amplifier operatively coupled to the multi-die acoustic wave filter.

The radio frequency amplifier can be a low noise amplifier. The multi-chip module can include a switch configured to selectively couple the multi-die acoustic wave filter to the low noise amplifier.

The radio frequency amplifier can be a power amplifier.

Another aspect of this disclosure is a wireless communication device. The wireless communication device includes a multiplexer, an antenna operatively coupled to a common node of the multiplexer, a radio frequency amplifier operatively coupled to a filter of the multiplexer, and a transceiver in communication with the radio frequency amplifier. The multiplexer includes a filter that includes acoustic wave resonators on a plurality of dies in accordance with any suitable principles and advantages disclosed herein.

The wireless communication device can include a baseband processor in communication with the transceiver.

The multiplexer can be included in a radio frequency front end. The multiplexer can be included in a diversity receive module.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
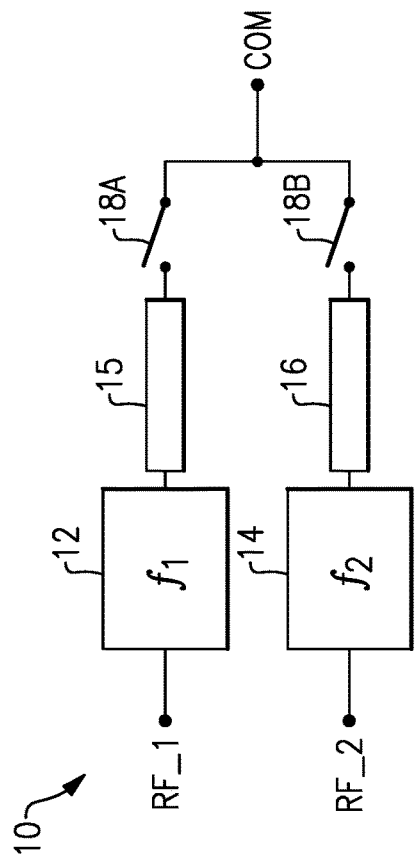
FIG. 1 is a schematic block diagram of a multiplexer.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A multiplexer can include a plurality of acoustic wave filters implemented on a plurality of die. When each acoustic wave filter is implemented on a separate die, a transmission line exists between acoustic resonators of an acoustic wave filter and a common node of the multiplexer. The transmission line can lead to insertion loss degradation due to worse impedance matching and reflection coefficient (gamma).

To reduce impedance mismatches resulting from a transmission line between acoustic resonators of a filter and a common node of a multiplexer, a circuit including an inductor and a capacitor can be arranged to provide phase rotation. However, both insertion loss and gamma of the acoustic wave filter can be degraded due to finite quality factor (Q) of the inductor and capacitor circuit arranged to provide phase rotation. In addition, module size and cost can be increased by the inductor and capacitor circuit.

Aspects of this disclosure relate to a multiplexer that includes an acoustic wave filter including acoustic wave resonators on at least two die with a transmission line electrically connecting the acoustic wave resonators on the two die. For example, an acoustic wave filter can include acoustic wave resonators on a first die electrically connected to at least one acoustic wave resonator on a second die via a transmission line. In this example, the acoustic wave resonators on the first die can be electrically connected to a common node of a multiplexer by way of an acoustic wave resonator on the second die. The acoustic wave resonator on the second die can provide a high impedance at a respective passband of one or more other filters of the multiplexer. Accordingly, effects of the transmission line of the acoustic wave filter on a respective passband of one or more other filters of the multiplexer can be reduced and/or eliminated.

Multiplexers disclosed herein can achieve lower insertion loss. Multiplexers disclosed herein can also be implemented in a module with reduced size relative to a module with a phase rotation circuit (e.g., an inductor and capacitor circuit) arranged to improve impedance matching for an acoustic wave filter.

Multiplexers disclosed herein can include one or more filters arranged to filter a radio frequency signal in a fifth generation (5G) New Radio (NR) operating band within Frequency Range 1 (FR1). FR1 can from 410 megahertz (MHz) to 7.125 gigahertz (GHz), for example, as specified in a current 5G NR specification. A filter arranged to filter a radio frequency signal in a 5G NR FR1 operating band can be an acoustic wave filter that includes acoustic resonators on a plurality of different die in accordance with any suitable principles and advantages disclosed herein. A filter arranged to filter a radio frequency signal in fourth generation (4G) Long Term Evolution (LTE) operating band can be an acoustic wave filter that includes acoustic resonators on a plurality of different die in accordance with any suitable principles and advantages disclosed herein. In some instances, a multi-die acoustic wave filter can be arranged to have a passband that spans a 5G NR FR1 operating band and also a 4G LTE operating band. Multiplexers disclosed herein can be implanted in dual connectivity applications.

Acoustic wave filters arranged to filter signals within a 5G NR operating band can have wider bandwidth than acoustic wave filters arranged to filter only 4G LTE signals. For example, Band n70 is wider than Band 25. This can present technical challenges. Technical solutions disclosed herein can address such technical challenges. Carrier aggregation specifications in 5G can be more difficult to meet than certain 4G carrier aggregation specifications.

Technical solutions disclosed herein can be implemented in carrier aggregation applications. For example, technical solutions disclosed herein can provide desirable phase and/or impedance rotation characteristics for an acoustic wave filter. This can increase a refection coefficient of one filter of a multiplexer in a passband of another filter of the multiplexer.

Multi-die acoustic wave filters disclosed herein can achieve a relatively wide passband and a relatively high electromechanical coupling coefficient ($k^2$). Such filters can also achieve a passband with relatively sharp edges. In a filter with acoustic resonators on a plurality of different die, stacks of acoustic resonators on different filters can be separately adjusted. The electromechanical coupling coefficient can be increased, for example, by adjusting an acoustic resonator stack on a die closest to the common node of a multiplexer. For instance, the acoustic wave filter can include bulk acoustic wave resonators on a first die electrically connected to one or more temperature compensated surface acoustic wave resonators on a second die via a transmission line. The one or more temperature compensated surface acoustic wave resonators can include a front end resonator closest to the common node of a multiplexer. The bulk acoustic wave resonators of the multi-die acoustic wave filter can encounter difficulties in maintaining relatively high electromechanical coupling coefficient and quality factor (Q) over a relatively wide bandwidth. By adjusting the stack of the temperature compensated surface acoustic wave resonator on the die closest to the common node of the multiplexer, electromechanical coupling coefficient of the multi-die acoustic wave filter can be increased. At the same time, the BAW resonators can realize a relatively wide passband for the multi-die acoustic wave filter.

FIG. 1 is a schematic block diagram of a multiplexer 10. As illustrated, the multiplexer 10 includes a first filter 12, a second filter 14, a first transmission line 15, a second transmission line 16, and a radio frequency switch with switch arms 18A and 18B.

The first filter 12 is electrically coupled between a first radio frequency input/output port RF_1 and a common node COM of the multiplexer 10. The common node COM can be referred to as a common port. The first radio frequency input/output port RF_1 can be an output in instances where the first filter 12 is a receive filter. The first radio frequency input/output port RF_1 can be an input in instances where the first filter 12 is a transmit filter. The first filter 12 is coupled to the radio frequency switch via the first transmission line 15. The first switch arm 18A can selectively electrically couple the first filter 12 to the common node COM.

The second filter 14 is electrically coupled between a second radio frequency input/output port RF_2 and the common node COM. The second radio frequency input/output port RF_2 can be an output in instances where the second filter 14 is a receive filter. The second radio frequency input/output port RF_2 can be an input in instances where the second filter 14 is a transmit filter. The second filter 14 is coupled to the radio frequency switch via the second transmission line 16. The second switch arm 18B can selectively electrically couple the second filter 14 to the common node COM. The multiplexer 10 is a duplexer as illustrated.

The first filter 12 can be arranged to be open for a passband of the second filter 14. Similarly, the second filter 14 can be arranged to be open for a passband of the first filter 12. With the filters 12 and 14 of the multiplexer 10 arranged to be open at passbands of each other, loading loss can be reduced and/or eliminated.

Figure 2B:
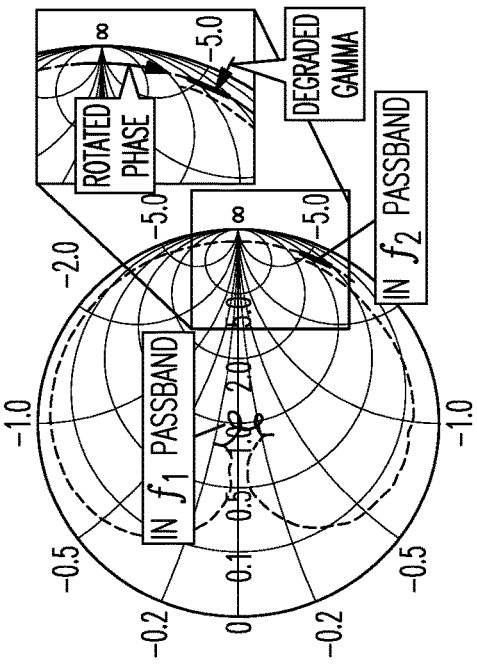
FIG. 2B is a Smith chart of a standalone filter of the multiplexer of FIG. 1 that illustrates rotated phase and degraded reflection coefficient due to a transmission line.
Figure 2A:
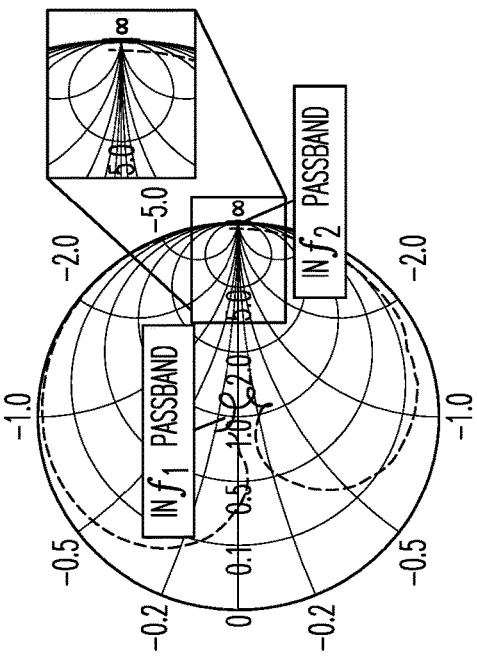
FIG. 2A is a Smith chart of a standalone filter of the multiplexer of FIG. 1 without a transmission line as the ideal case.

FIG. 2A is a Smith chart of a standalone filter of the multiplexer of FIG. 1 without the transmission line 15 as the ideal case. The Smith chart of FIG. 2A corresponds to the first filter 12 in the multiplexer 10 of FIG. 1 without the transmission line 15 as the ideal case. This Smith chart indicates open impedance for the first filter 12 in the passband of the second filter 14.

FIG. 2B is a Smith chart of a standalone filter of the multiplexer of FIG. 1 that illustrates rotated phase and degraded reflection coefficient due to a transmission line. The transmission lines 15 and 16 illustrated in FIG. 1 can impact insertion loss. The transmission lines 15 and 16 each have a respective time delay and resistance. Such time delays and resistances can result in impedance mismatches and a reduction in gamma of the filters 12 and 14 of the multiplexer 10.

The Smith chart of FIG. 2B corresponds to the first filter 12 in the multiplexer 10 of FIG. 1 with the transmission line 15 having a time delay and resistance. The Smith chart shown in FIG. 2B indicates a rotated phase and degraded gamma for the first filter 12 due to impacts of the transmission line 15. The rotated phase and degraded gamma result in higher insertion loss in the multiplexer 10. For example, FIG. 2B indicates that the impedance of the first filter 12 in the passband for the second filter 14 is rotated relative to FIG. 2A. This impedance rotation and gamma degradation for the first filter 12 in the passband of the second filter 14 can result in a higher insertion loss for the second filter 14 in the passband of the second filter 14.

Figure 3:
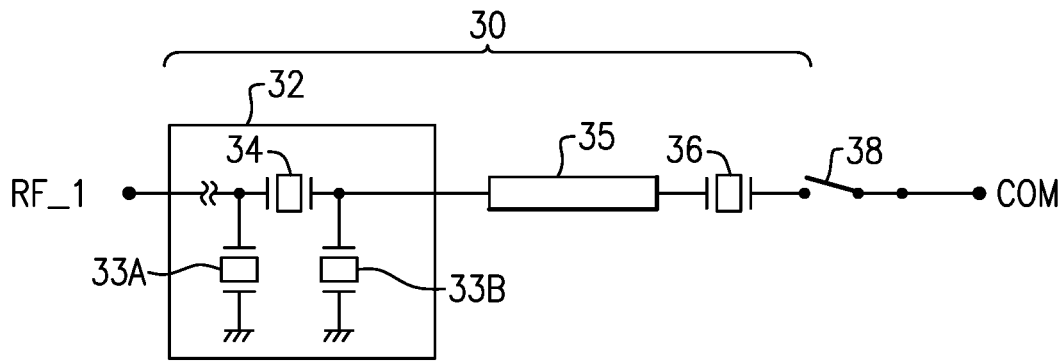
FIG. 3 is a schematic diagram that includes a filter of a multiplexer according to an embodiment.

FIG. 3 is a schematic diagram that includes a filter 30 of a multiplexer according to an embodiment. As illustrated, the filter 30 includes acoustic resonators 33A, 33B, and 34 on a first die 32 and an acoustic resonator 36 external to the first die 32. The acoustic resonator 36 is electrically connected to the acoustic resonators 33A, 33B, and 34 of the first die 32 via a transmission line 35. The transmission line extends from the first die 32 to another die that includes the acoustic resonator 36. A switch 38 is arranged to selectively electrically connect the acoustic resonators of the filter 30 to a common node COM of the multiplexer. The multiplexer includes one or more additional filters (not shown in FIG. 3) that are arranged to be electrically coupled to the common node COM.

In the filter 30, the acoustic resonator 36 is coupled between the transmission line 35 and the common node COM of the multiplexer. Accordingly, a series acoustic resonator 36 is coupled between the transmission line 35 and the common node COM in the filter 30. The acoustic resonator 36 can be high impedance at respective passbands of one or more other filters of the multiplexer. The topology of the filter 30 can reduce and/or eliminate effects of the transmission line 35 on passbands of one or more other filters of the multiplexer.

Figure 4:
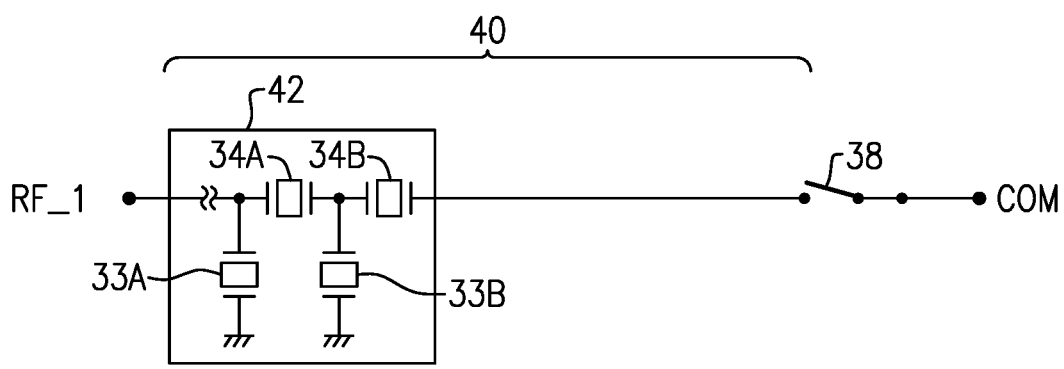
FIG. 4 is a schematic diagram that includes a filter of a multiplexer without a transmission line as the ideal case.

FIG. 4 is a schematic diagram that includes a filter 40 of a multiplexer without a transmission line as the ideal case. The filter 30 includes acoustic resonators 33A, 33B, 34A, and 34B on a single die 42. The acoustic resonators 33A, 33B, 34A, and 34B are electrically connected to the switch 38 without a transmission line.

Figure 5:
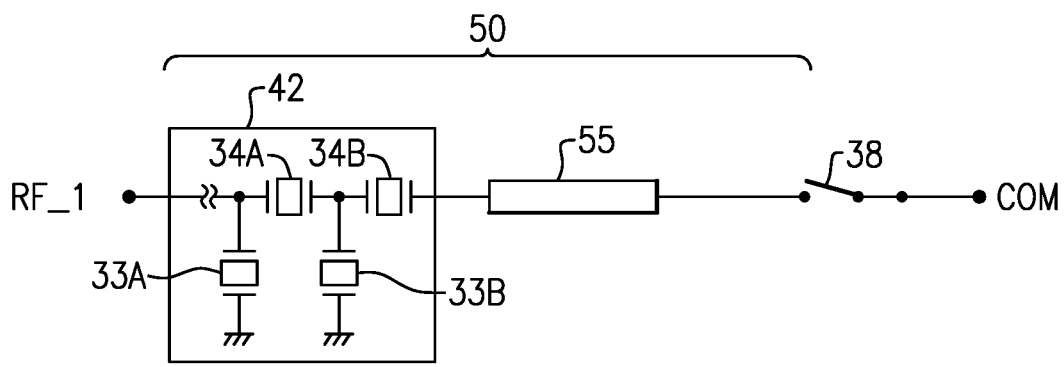
FIG. 5 is a schematic diagram that includes a filter of a multiplexer with a transmission line with a time delay and resistance.

FIG. 5 is a schematic diagram that includes a filter 50 of a multiplexer with a transmission line 55 with a time delay and resistance. The filter 50 is like the filter 40 of FIG. 4 except that the transmission line 55 has the time delay and resistance.

Figure 6A:
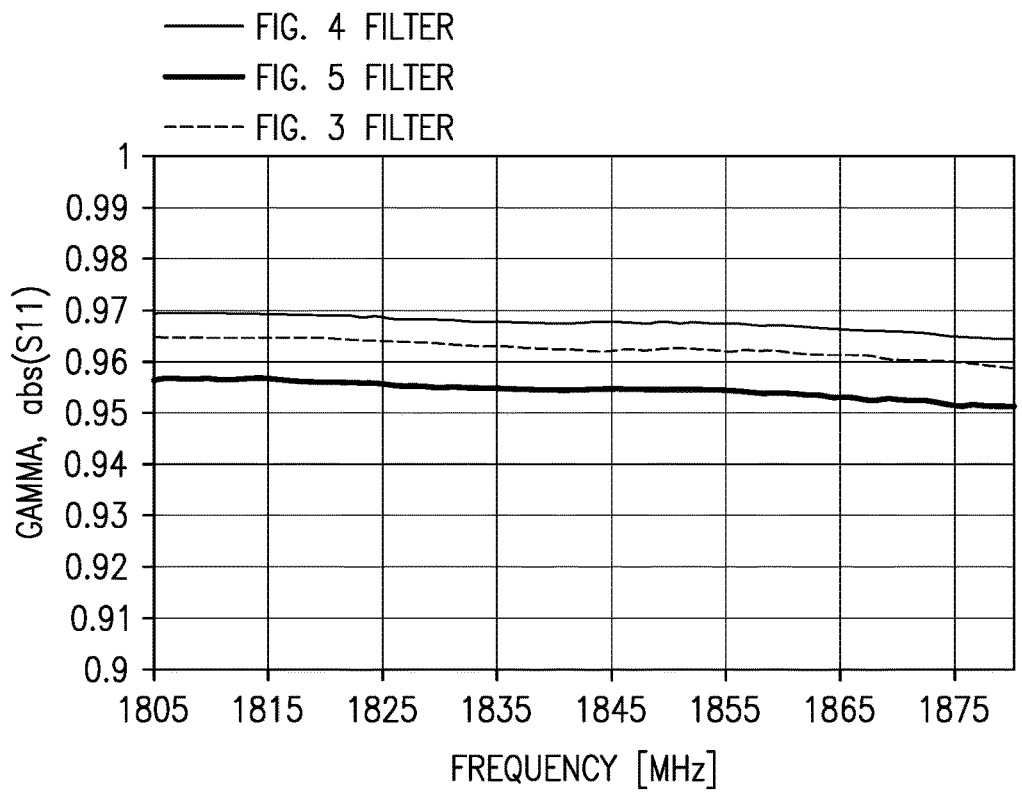
FIG. 6A is a graph of a reflection coefficient for the filters of FIGS. 3, 4, and 5.

FIG. 6A is a graph of a reflection coefficient (gamma) for the filters of FIGS. 3, 4, and 5. FIG. 6A indicates that gamma is degraded for the filter 50 of FIG. 5 relative to the filter 30 of FIG. 3 and the filter 40 of FIG. 4 in the frequency range shown. FIG. 6A indicates that gamma for the filter 30 is increased relative to the filter 50. The increase in gamma for the filter 30 can be due to including the series acoustic resonator 36 between the transmission line 35 and other acoustic resonators 33A, 33B, and 34 of the filter 30. Gamma for the filter 30 is relatively close to the gamma for the filter 40 without a transmission line as the ideal case.

Figure 6B:
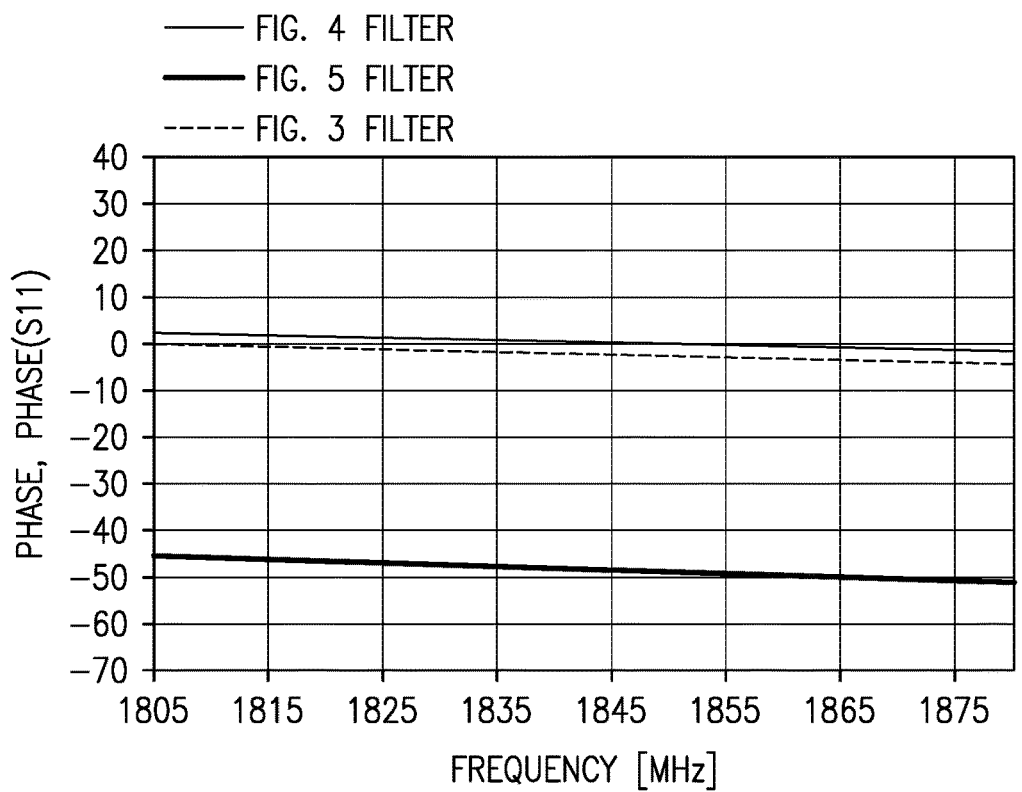
FIG. 6B is a graph of a phase shift for the filters of FIGS. 3, 4, and 5.

FIG. 6B is a graph of a phase shift for the filters of FIGS. 3, 4, and 5. FIG. 6B indicates that the phase shift for the filter 50 has a significantly higher magnitude than for the filters 30 and 40. The filter 30 can achieve similar phase rotation to the filter 40. FIG. 6B indicates that the topology of the filter 30 can reduce the magnitude of phase rotation relative to the filter 50. This can be a result of reducing effects of the transmission line 35 in the topology of the filter 30.

Multiplexers can be included in multi-chip modules that include a plurality of die on a common packaging substrate. The plurality of die can be enclosed by a packaging structure, such as an overmold structure. The multi-chip module can include two or more acoustic resonator die that include acoustic resonators of filters of a multiplexer. The multi-chip module can include one or more radio frequency amplifiers. The one or more radio frequency amplifiers can include one or more power amplifiers and/or one or more low noise amplifiers. The multi-chip module can include an antenna switch module.

Example multi-chip modules that include a multiplexer with an acoustic wave filter having acoustic wave resonators on at least two die with a transmission line electrically connecting the acoustic wave resonators on the two die will be discussed with reference to FIGS. 7 and 9 to 19. In these multiplexers, the effects of the transmission line of the acoustic wave filter on respective passbands of one or more other filters of the multiplexer can be reduced and/or eliminated. One or more of the example multi-chip modules can implement a diversity switching module. One or more of the example multi-chip modules can implement a mid high band power amplifier module with a multiplexer. Although example embodiments may be discussed with reference to a triplexer for illustrative purposes, any suitable principles and advantages disclosed herein can be applied to other multiplexers, such as duplexers, quadplexers, hexaplexers, and the like. Any suitable principles and advantages of the multi-chip modules disclosed herein can be implemented together with each other.

Figure 7:
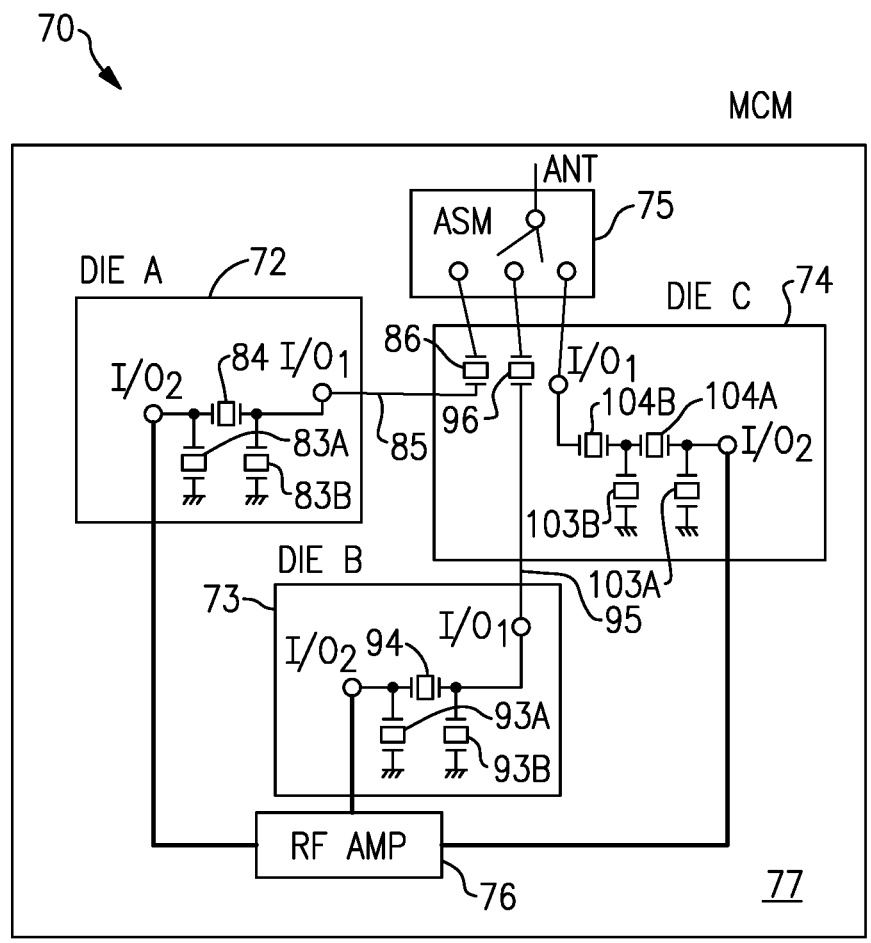
FIG. 7 is schematic diagram of a multi-chip module that includes a multiplexer with an acoustic wave filter having resonators on a plurality of die according to an embodiment.

FIG. 7 is schematic diagram of a multi-chip module 70 that includes a multiplexer with an acoustic wave filter having resonators on a plurality of die according to an embodiment. As illustrated, the multi-chip module 70 includes a first acoustic resonator die 72, a second acoustic resonator die 74, a third acoustic resonator die 73, an antenna switch module 75, and one or more radio frequency amplifiers 76. The acoustic resonator die 72 to 74, the antenna switch module 75, and the one or more radio frequency amplifiers 76 are all positioned on a packaging substrate 77. The packaging substrate 77 can be a laminate substrate, for example.

The multi-chip module 70 includes a triplexer that includes three acoustic wave filters coupled to a common node ANT. The illustrated common node ANT is an antenna node. The triplexer includes a first filter, a second filter, and a third filter. The illustrated filters are acoustic wave filters that each have a ladder topology. The illustrated filters can each be a band pass filter. One or more filters of the multiplexer can have a different filter topology such as a lattice topology or a hybrid lattice and ladder topology. In some instances, the multiplexer can include a Multi-Mode SAW (MMS) filter, such as a double-mode SAW (DMS) filter. In some instances, one or more filters of a multiplexer can include a non-acoustic filter and/or a hybrid acoustic wave and inductor-capacitor (LC) filter.

In certain applications, the first, second, and third filters can all be receive filters. Such applications can include diversity receive applications. When the illustrated filters are each receive filters, a first input/output port $I/O_1$ can be an input port and a second input/output port $I/O_2$ can be an output port in each respective filter. According to some other applications, the first, second, and third filters can all be transmit filters. When the illustrated filters are each transmit filters, a first input/output port $I/O_1$ can be an output port and a second input/output port $I/O_2$ can be an input port in each respective filter. The first, second, and third filters can include any suitable combination of one or more transmit filters and/or one or more receive filters. The triplexer of the multi-chip module 70 can be implemented in carrier aggregation applications.

As shown in FIG. 7, the second acoustic resonator die 74 includes at least one acoustic resonator of each of the three filters of the triplexer. Accordingly, in certain embodiments, all filters of a multiplexer can be electrically connected to common node by way of a respective acoustic resonator on a common die to reduce and/or eliminate effects of transmission lines between respective filters and common node on passbands of one or more other filters. Acoustic wave filters discussed herein may include a certain number of acoustic resonators (e.g., 4) for illustrative purposes. The principles and advantages disclosed herein can be applied to filters having any suitable number of acoustic resonators.

The first filter includes acoustic resonators 83A, 83B, and 84 on the first acoustic resonator die 72 electrically connected to acoustic resonator 86 on the second acoustic resonator die 74 via a transmission line 85. The first filter can be referred to as a multi-die acoustic wave filter. The first filter can be a band pass filter having a bandwidth in a range from about 3% to 7% of a center frequency of the passband of the first filter. For example, the first filter can be a band pass filter with a bandwidth of at least about 4% of its center frequency. The transmission line 85 can have a length in a range from 50 micrometers to 2 millimeters, for example. In some instances, the transmission line 85 can have a length in a range from 100 micrometers to 1 millimeter. The series resonator 86 can have high impedance in passbands of the second filter and/or the third filter. Accordingly, this can reduce and/or eliminate effects of the transmission line 85 on passbands of second filter and/or the third filter. In some applications, the series resonator 86 can be replaced by two resonators arranged in anti-series with each other. The two anti-series resonators are connected in series with each other with their polarities reversed. In such an application, there is still a series resonator of the first filter coupled between acoustic resonators on the first acoustic resonator die 72 and the common node of the multiplexer.

The second filter includes acoustic resonators 93A, 93B, and 94 on the third acoustic resonator die 73 electrically connected to acoustic resonator 96 on the second acoustic resonator die 74 via a transmission line 95. The second filter can be a band pass filter having a bandwidth in a range from about 3% to 7% of a center frequency of the passband of the second filter. For example, the second filter can be a band pass filter with a bandwidth of at least about 4% of its center frequency. The transmission line 95 can have a length in a range from 50 micrometers to 2 millimeters, for example. In some instances, the transmission line 95 can have a length in a range from 100 micrometers to 1 millimeter. The series resonator 96 can have high impedance in passbands of the first filter and/or the third filter.

The third filter includes acoustic resonators 103A, 103B, 104A, and 104B on the second acoustic resonator die 74. All acoustic resonators of the third filter can be on the second acoustic resonator die 74. The second acoustic resonator die 74 includes a plurality of series resonators and a plurality of shunt resonators of the third filter in addition to an acoustic resonator of each of the first and second filters. Although the first, second, and third filters shown in FIG. 7 include 4 acoustic resonators for illustrative purposes, any suitable number of shunt and/or series resonators can be implemented in a filter of a multiplexer in accordance with any suitable principles and advantages disclosed herein.

The filters of the triplexer shown in FIG. 7 can include surface acoustic wave (SAW) resonators, bulk acoustic wave (BAW) resonators, or any suitable combination of SAW and BAW resonators. As an example, each of the illustrated acoustic resonator die 72, 73, and 74 can include SAW resonators or BAW resonators. The SAW resonators can include temperature compensated SAW (TCSAW) resonators in certain instances. A TCSAW resonator typically includes a temperature compensation layer, such as a silicon dioxide layer, over an interdigital transducer electrode to bring a temperature coefficient of frequency (TCF) closer to zero. In some other applications, one or more of the illustrated die can include a Lamb wave resonator and/or a boundary acoustic wave resonator.

In certain applications, the first acoustic resonator die 72 and/or the third acoustic resonator die 73 can include a different type of acoustic resonator than the second acoustic resonator die 74. For example, the first acoustic resonator die 72 can be a BAW die and the second acoustic resonator die 74 can be a SAW die. In some such instances, the second acoustic resonator die 74 can be a TCSAW die.

In some applications, the first acoustic resonator die 72 and/or the third acoustic resonator die 73 can include acoustic resonators of the same type as the second acoustic resonator die 74. For instance, the first acoustic resonator die 72 can be a SAW die and the second acoustic resonator die 74 can be a SAW die. As another example, the first acoustic resonator die 72 can be a BAW die and the second acoustic resonator die 74 can be a BAW die.

Non acoustic passive components, such as surface mount technology (SMT) components (not illustrated in FIG. 7), can be coupled to an input/output ports of one or more of the illustrated filters.

The first, second, and third filters of the triplexer illustrated in FIG. 7 are each coupled to the common node ANT by way of the antenna switch module 75. Each filter is coupled to a respective throw of a multi-throw switch of the antenna switch module 75. The multi-throw switch can selectively electrically connect one or more of the filters of the triplexer to the common node ANT. The multi-throw switch of the antenna switch module 75 can implement switched multiplexing. In some other embodiments, such as the embodiments shown in FIGS. 9, 12, and 15, a multiplexer can be implemented without a switch coupled between any filters of the triplexer and the common node ANT. Such an arrangement can be referred to as fixed multiplexing.

The one or more radio frequency amplifiers 76 can be coupled to each of the filters of the triplexer. The one or more radio frequency amplifiers 76 can include one or more low noise amplifiers and/or one or more power amplifiers. The one or more radio frequency amplifiers 76 can include two or more radio frequency amplifiers. In certain applications, the one or more radio frequency amplifiers 76 can be implemented on one or more radio frequency amplifier dies. Examples of the one or more radio frequency amplifiers 76 will be discussed with reference to FIGS. 8A to 8C.

Figure 8A:
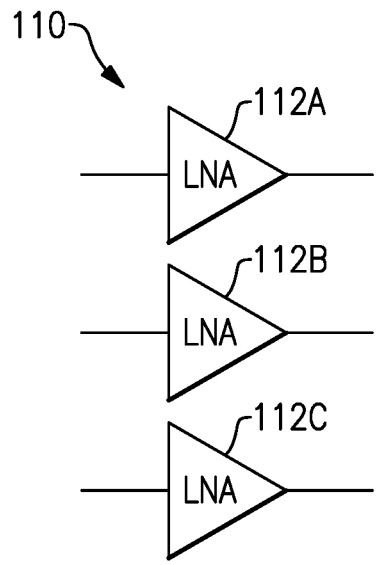
FIG. 8A is a schematic diagram of example radio frequency amplifiers of the multi-chip module of FIG. 7.

FIG. 8A is a schematic diagram of example radio frequency amplifiers 110 of a multi-chip module, such as the multi-chip module 70 of FIG. 7. The radio frequency amplifiers 110 are an example of the one or more radio frequency amplifiers 76 of FIG. 7 that includes a separate low noise amplifier operatively coupled to each filter of a multiplexer. As illustrated, the radio frequency amplifiers 110 include a first low noise amplifier 112A, a second low noise amplifier 112B, and a third low noise amplifier 112C. These low noise amplifiers can each be electrically coupled to a different receive filter in a multiplexer in accordance with any suitable principles and advantages disclosed herein.

Figure 8B:
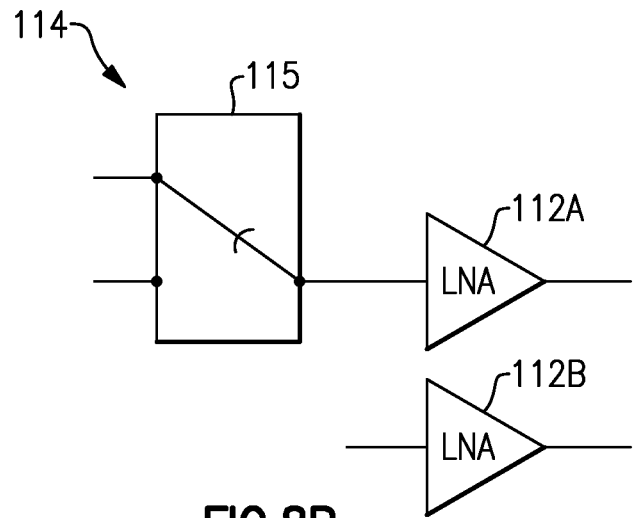
FIG. 8B is a schematic diagram of example radio frequency amplifiers of the multi-chip module of FIG. 7.

FIG. 8B is a schematic diagram of example radio frequency amplifiers of a multi-chip module, such as the multi-chip module 70 of FIG. 7. A radio frequency amplification circuit 114 of FIG. 7 includes an example of the one or more radio frequency amplifiers 76 of FIG. 7. The radio frequency amplification circuit 114 includes low noise amplifiers 112A and 112B and a radio frequency switch 115. The radio frequency switch 115 can selectively electrically connect the low noise amplifier 112A to a selected one of the filters of the triplexer of FIG. 7. The radio frequency switch 115 can electrically connect one filter to the low noise amplifier 112A in a first state and electrically connect another filter to the low noise amplifier 112A in a second state. The other low noise amplifier 112B can be electrically connected to a different filter of the multiplexer.

FIG. 8B illustrates that one or more filters of a multiplexer can be selectively electrically connected to a radio frequency amplifier (e.g., a low noise amplifier or a power amplifier) via a radio frequency switch. In such instances, a radio frequency amplifier can be shared among two or more filters of the multiplexer.

Figure 8C:
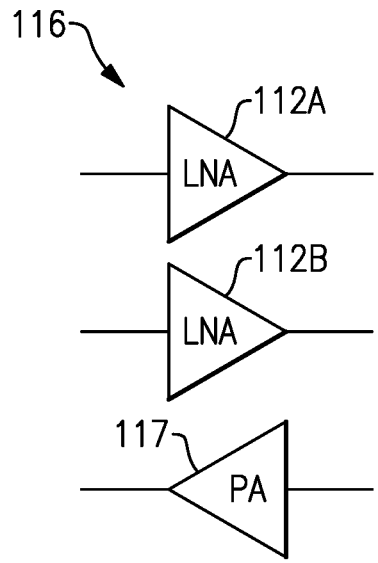
FIG. 8C is another schematic diagram of example radio frequency amplifiers of the multi-chip module of FIG. 7.

FIG. 8C is another schematic diagram of example radio frequency amplifiers 116 of a multi-chip module, such as the multi-chip module 70 of FIG. 7. The radio frequency amplifiers 116 are an example of the one or more radio frequency amplifiers 76 of FIG. 7 that includes a separate radio amplifiers operatively coupled to respective filters of a multiplexer. As illustrated, the radio frequency amplifiers 116 include a first low noise amplifier 112A, a second low noise amplifier 112B, and a power amplifier 117. Any suitable combination of one or more power amplifiers and one or more low noise amplifiers can be coupled to filters of a multiplexer in accordance with any suitable principles and advantages disclosed herein.

Figure 9:
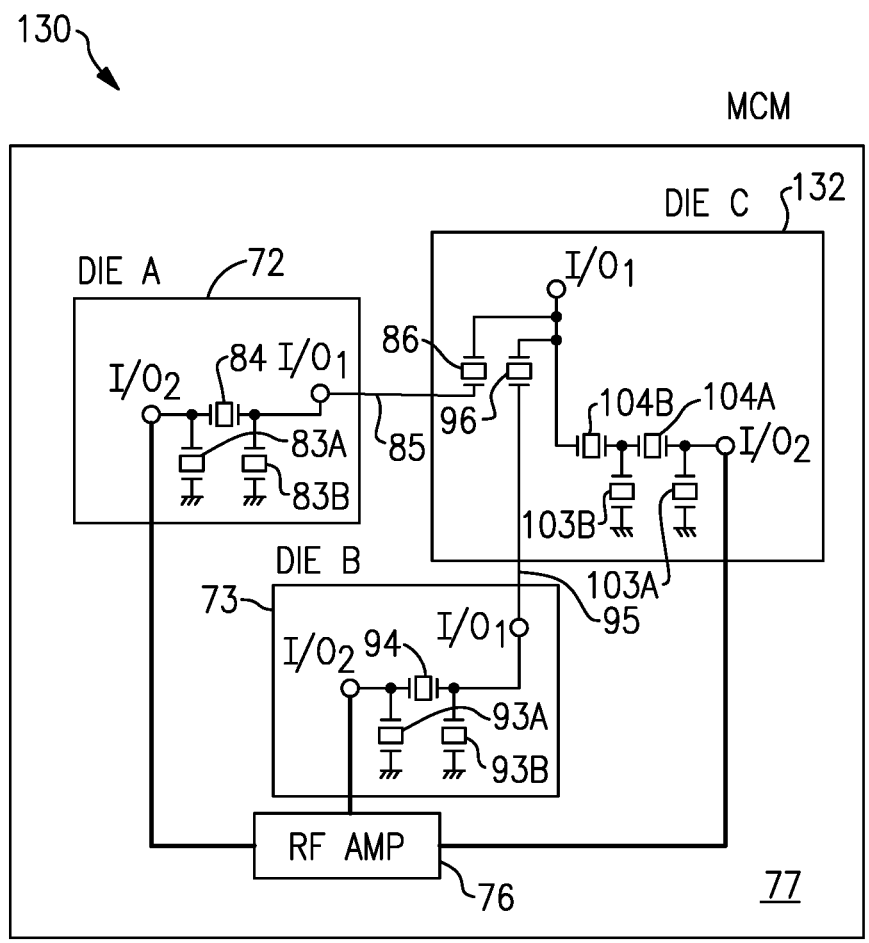
FIG. 9 is schematic diagram of a multi-chip module that includes a multiplexer with an acoustic wave filter having resonators on a plurality of die according to an embodiment.

FIG. 9 is schematic diagram of a multi-chip module 130 that includes a multiplexer with an acoustic wave filter having resonators on a plurality of die according to an embodiment. In the multi-chip module 130, each filter of the multiplexer is electrically coupled to a common node without an intervening switch. The multi-chip module 130 is similar to the multi-chip module 70 of FIG. 7 except that the first second, and third filters are coupled to each other at a common node on a second acoustic resonator die 132 in the multi-chip module 130 and the multi-chip module 130 does not include an antenna switch module. The second acoustic resonator die 132 is similar to the second acoustic resonator die 74 of FIG. 7 except that the second acoustic resonator die 132 includes an input/output contact coupled to the common node of the multiplexer. In contrast, the second acoustic resonator die 74 of FIG. 7 includes separate input/output contacts for each filters of the triplexer of FIG. 7.

Figure 10:
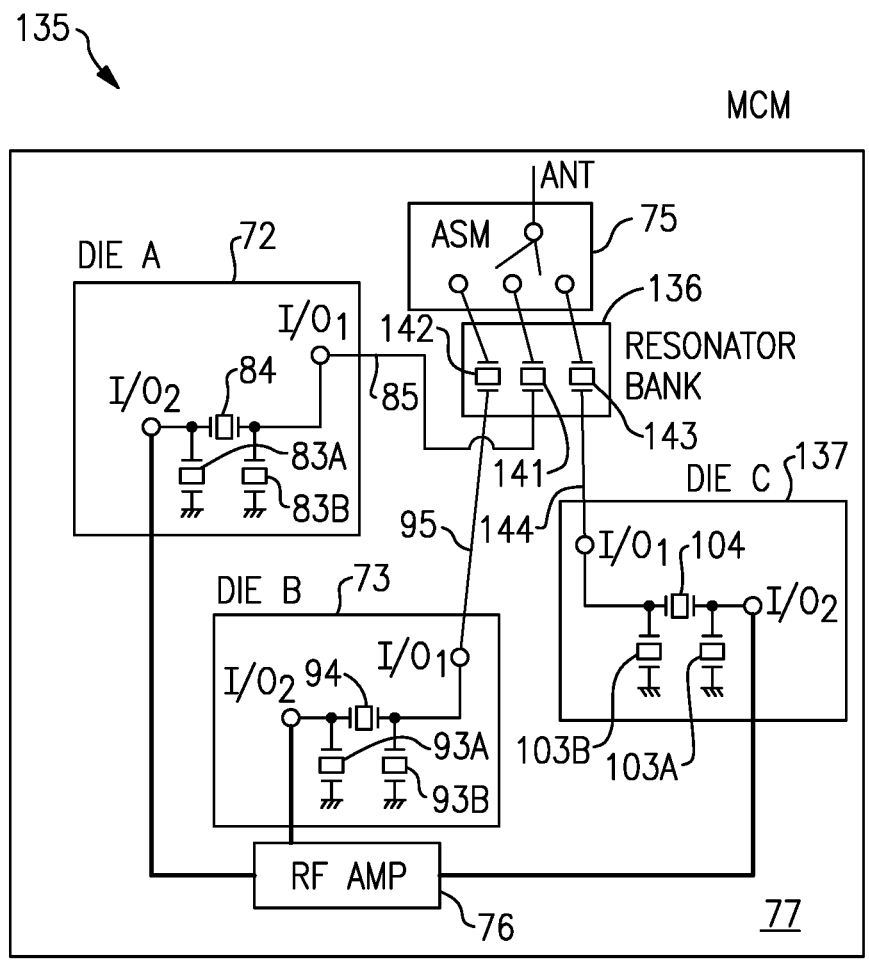
FIG. 10 is schematic diagram of a multi-chip module that includes a multiplexer with acoustic wave filters each having resonators on a plurality of die according to an embodiment.

FIG. 10 is schematic diagram of a multi-chip module 135 that includes a multiplexer with acoustic wave filters each having resonators on a plurality of die according to an embodiment. FIG. 10 illustrates that front end acoustic resonators of different filters of a multiplexer can be included on a resonator bank die 136. A front end acoustic resonator can be an acoustic resonator through which other acoustic resonators of a filter are coupled to a common node and/or an antenna node. The multi-chip module 135 includes a first acoustic resonator die 72, a resonator bank die 136, a third acoustic resonator die 73, a fourth acoustic resonator die 137, an antenna switch module 75, and one or more radio frequency amplifiers 76. The illustrated resonator bank die 136 includes an acoustic resonator of each filter of the multiplexer.

Each acoustic resonator die 72, 73, 137, and 136 can be a BAW resonator die or a SAW resonator die. The resonator bank die 136 can be a SAW resonator die in certain applications. When the resonator bank die 136 die is a SAW resonator die, operating frequencies for different SAW resonators can be adjusted by adjusting interdigital transducer (IDT) electrode finger pitch for respective SAW resonators. The resonator bank die 136 can be a BAW resonator die in some other applications. The resonator bank die 136 can include acoustic resonators of the same type as one or more of the other acoustic resonator die 72, 73, 137 in certain instances.

In an embodiment, the resonator bank die 136 can be a TCSAW die and one or more of the acoustic resonator die 72, 73, and 137 can be BAW die. A transmit filter with BAW resonators 93A, 93B, 94 on the third acoustic resonator die 73 and a TCSAW resonator 142 on the resonator bank die 136 can achieve a relatively wide passband and a relatively high $k^2$. With the acoustic resonator 142 being a TCSAW resonator and the acoustic resonators 93A, 93B, and 94 being BAW resonators, non-linearity, such as second harmonic distortion, associated with the acoustic resonators 93A, 93B, and 94 being BAW resonators can be reduced.

In FIG. 10, the multiplexer includes a first filter, a second filter, and a third filter. The first filter includes acoustic resonators 83A, 83B, and 84 on the first acoustic resonator die 72 and an acoustic resonator 141 of the resonator bank die 136. The acoustic resonator 141 is a series acoustic resonator as illustrated. The acoustic resonator 141 can have a high impedance in a passband of the second filter and/or in a passband of the third filter. The acoustic resonator 141 is electrically connected to the acoustic resonators 83A, 83B, and 84 of first acoustic resonator die 72 via transmission line 85.

The second filter includes acoustic resonators 93A, 93B, and 94 on the third acoustic resonator die 73 and an acoustic resonator 142 of the resonator bank die 136. The acoustic resonator 142 is a series acoustic resonator as illustrated. The acoustic resonator 142 can have a high impedance in a passband of the first filter and/or in a passband of the third filter. The acoustic resonator 142 is electrically connected to the acoustic resonators 93A, 93B, and 94 of third acoustic resonator die 73 via transmission line 95.

In the multi-chip module 135, the third filter includes acoustic resonators 103A, 103B, and 104 on the fourth acoustic resonator die 137 and an acoustic resonator 143 of the resonator bank die 136. The acoustic resonator 143 is a series acoustic resonator as illustrated. The acoustic resonator 143 can have a high impedance in a passband of the first filter and/or in a passband of the second filter. The acoustic resonator 143 is electrically connected to the acoustic resonators 103A, 103B, and 104 of the fourth acoustic resonator die 137 via transmission line 144.

The first filter, second filter, and third filter are coupled to the common node ANT by way of the antenna switch module 75 in the illustrated multi-chip module 135. Alternatively, in some other embodiments (not illustrated), two or more of the acoustic resonators 141, 142, and 143 can be coupled to each other on the resonator bank die 136. In some such instances, the common node can be on the resonator bank die 136.

Figure 11:
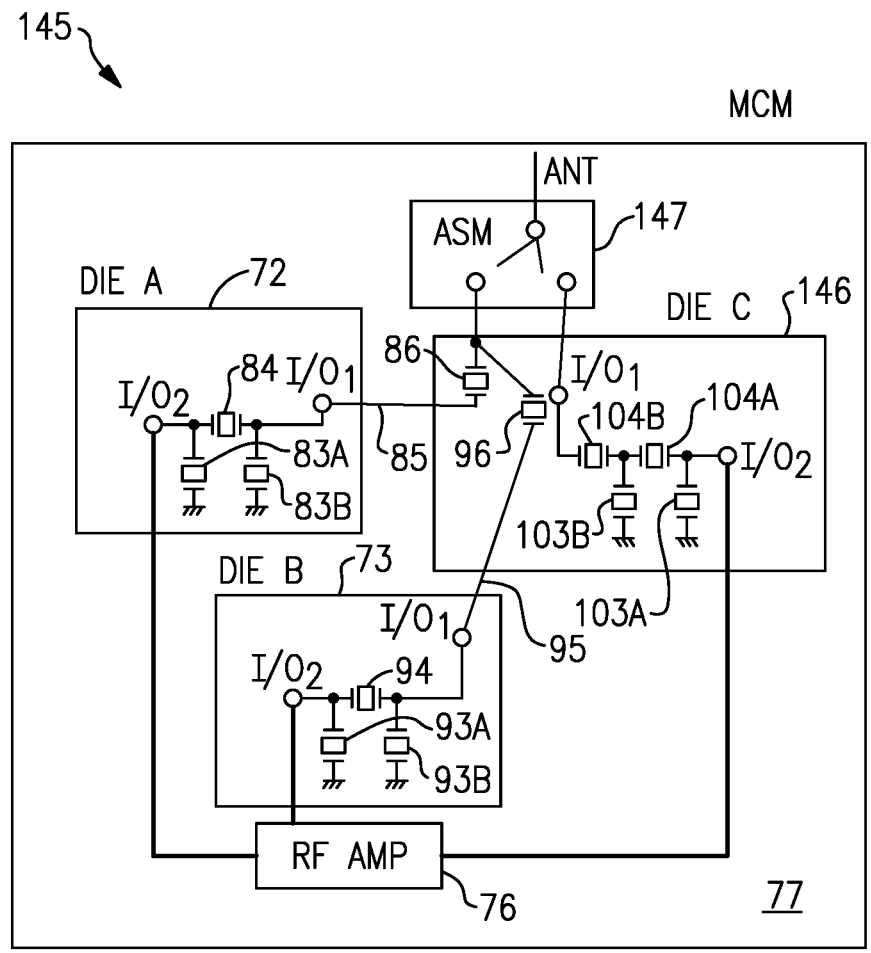
FIG. 11 is schematic diagram of a multi-chip module that includes a multiplexer with two acoustic wave filters electrically connected to each other on a die that includes at least one resonator of each of the two acoustic filters according to an embodiment.

FIG. 11 is schematic diagram of a multi-chip module 145 that includes a multiplexer with two acoustic wave filters electrically connected to each other on a die that includes at least one resonator of each of the two acoustic filters according to an embodiment. FIG. 11 illustrates that front end resonators can be connected on an acoustic resonator die. The multi-chip module 145 is like the multi-chip module 70 of FIG. 7 except that the third acoustic resonator die and antenna switch modules are different.

In the multi-chip module 145, a second acoustic resonator die 146 includes acoustic resonators 86 and 96 of the second and third filters, respectively, that are electrically connected to each other on the second acoustic resonator die 146. The acoustic resonators 86 and 96 are electrically connected to a common input/output contact of the second acoustic resonator die 146. The second acoustic resonator die 146 also includes acoustic resonators 103A, 103B, 104A, and 104B of the third filter.

An antenna switch module 147 includes a multi-throw radio frequency switch that includes a first throw electrically coupled to both the acoustic resonators 86 and 96 of the first and second filters, respectively, and a second throw electrically connected to the acoustic resonator 104B of the third filter. The first and second filters are connected together on the second acoustic resonator die 146 and electrically coupled to the common node ANT via the antenna switch module 147. The third filter is also electrically coupled to the common node ANT via the antenna switch module 147.

Figure 12:
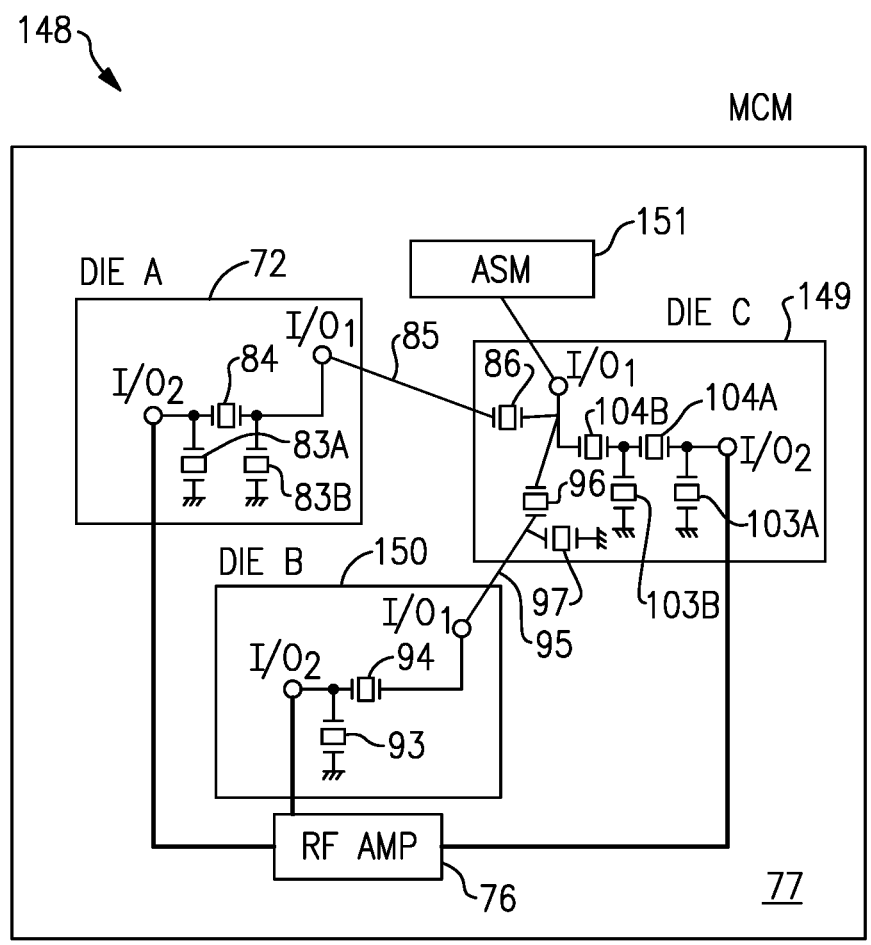
FIG. 12 is schematic diagram of a multi-chip module that includes a multiplexer with an acoustic wave filter having a series resonator and a shunt resonator on each of a plurality of die according to an embodiment.

FIG. 12 is schematic diagram of a multi-chip module 148 that includes a multiplexer with an acoustic wave filter having a series resonator and a shunt resonator on each of a plurality of die according to an embodiment. FIG. 12 illustrates that acoustic resonators on a first die can be electrically connected to a series acoustic resonator and a shunt acoustic resonator on another die via a transmission line, in which the series acoustic resonator and the second acoustic resonator are coupled to a node between the acoustic resonators on the first die and a common node of a multiplexer that includes the filter.

In the multi-chip module 148, a second acoustic resonator die 149 includes both a series acoustic resonator 96 and a shunt acoustic resonator 97 of the second filter. The series acoustic resonator 96 and the shunt acoustic resonator 97 are electrically connected to the acoustic resonators 93 and 94 of the second filter that are on a third acoustic resonator die 150 via transmission line 95. The first, second, and third filters of the multiplexer of the multi-chip module 148 are electrically connected to each other on the second acoustic resonator die 149. Accordingly, the common node of the multiplexer can be on the second acoustic resonator die 149. The common node can be electrically connected to an antenna switch module 151. The antenna switch module 151 can selectively electrically connect the common node of the multiplexer to an antenna port of the multi-chip module 148.

In some embodiments (not illustrated), the first filter can also include a series acoustic resonator and a shunt acoustic resonator on a second die. Accordingly, two or more filters of a multiplexer can each include a series resonator and a shunt resonator on a common acoustic resonator die that are electrically connected to respective other acoustic resonators on a different acoustic resonator die via a transmission line. In such embodiments, a multiplexer can include a plurality of acoustic wave filters each having a series resonator and a shunt resonator on each of a plurality of die.

Figure 13:
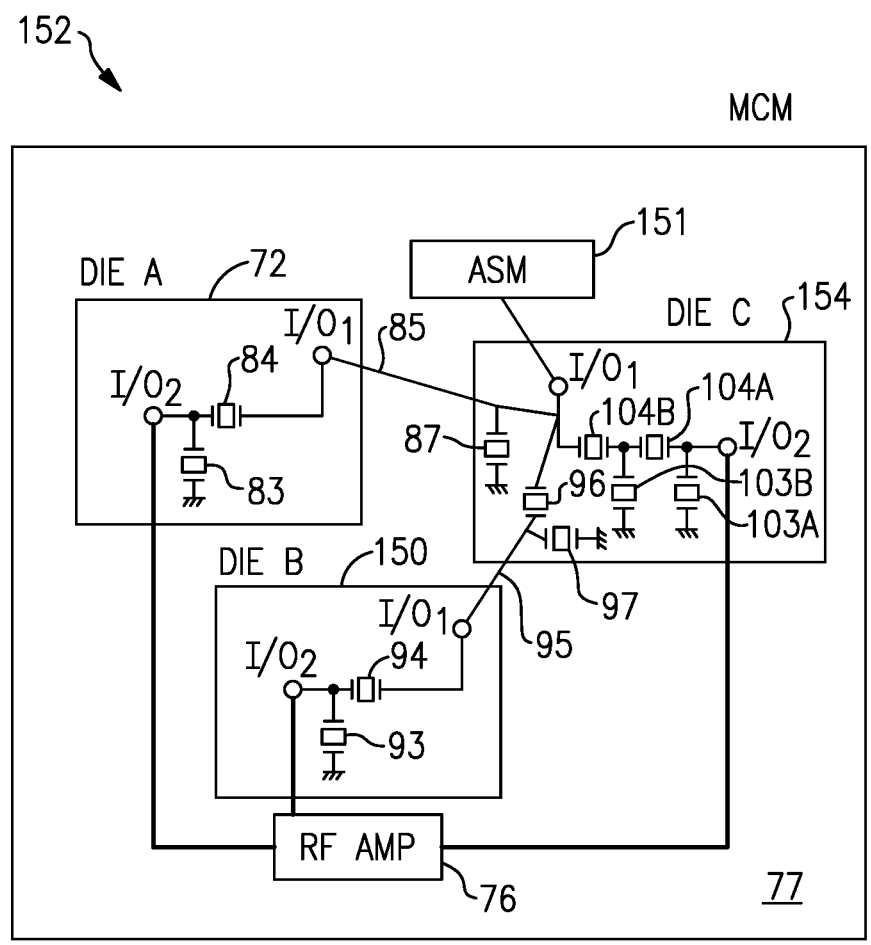
FIG. 13 is schematic diagram of a multi-chip module that includes a multiplexer with a plurality of acoustic wave filters each having a shunt resonator electrically connected to other acoustic wave resonators of a respective filter on another die via a respective transmission line according to an embodiment.

FIG. 13 is schematic diagram of a multi-chip module 152 that includes a multiplexer with a plurality of acoustic wave filters each having a shunt resonator electrically connected to other acoustic wave resonators of a respective filter on another die via a respective transmission line according to an embodiment. As shown in FIG. 13, the filter topology may start with a shunt resonator closest to the common node. In such instances, a shunt resonator of an acoustic filter can be electrically connected to other acoustic resonators of the acoustic filter that are on another die via a transmission line.

In the multi-chip module 152, a second acoustic resonator die 154 includes shunt acoustic resonators 87 and 97 of the first and second filters, respectively. The shunt acoustic resonator 87 can provide a high impedance in a passband of the second filter and/or a passband of the third filter of the multiplexer. The shunt acoustic resonator 87 of the first filter is electrically connected to acoustic resonators 83 and 84 of the first filter on the first acoustic resonator die 72 via transmission line 85 in FIG. 13. The illustrated second acoustic resonator die 154 also includes a series acoustic resonator 96 of the second filter. In FIG. 13, the series acoustic resonator 96 and the shunt acoustic resonator 97 of the second filter are electrically connected to the acoustic resonators 93 and 94 of the second filter on the third acoustic resonator die 150 via transmission line 95. The first, second, and third filters of the multiplexer are electrically connected to each other on the second acoustic resonator die 154.

Figure 14:
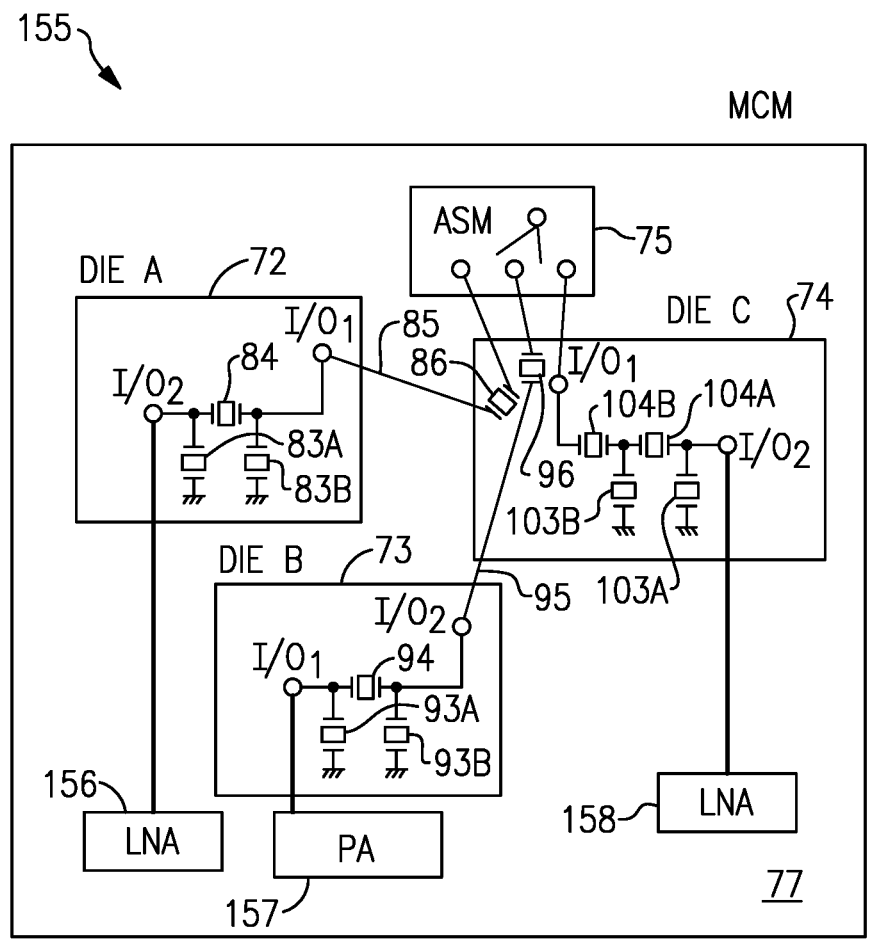
FIG. 14 is schematic diagram of a multi-chip module that includes low noise amplifiers, a power amplifier, and a multiplexer with an acoustic wave filter having resonators on a plurality of die according to an embodiment.

FIG. 14 is schematic diagram of a multi-chip module 155 that includes a first low noise amplifier 156, a power amplifier 157, a second low noise amplifier 158, and a multiplexer with an acoustic wave filter having resonators on a plurality of die according to an embodiment. The multi-chip module 155 is an example of the multi-chip module 70 of FIG. 7 in which the one or more radio frequency amplifiers 76 include the low noise amplifiers 156 and 158 and the power amplifier 157. FIG. 14 illustrates that one filter of a multiplexer can be a transmit filter electrically coupled to the power amplifier 157 and other filters of the multiplexer can be receive filters electrically coupled to respective low noise amplifiers 156 and 158. When a multiplexer includes one or more transmit filters and one or more receive filters, at least one power amplifier and at least one low noise amplifier can be electrically connected to filters of the multiplexer. One or more radio frequency amplifiers can be electrically coupled to any suitable combination of transmit and/or receive filters. Multiplexers in accordance with any suitable principles and advantages disclosed herein can include any suitable number of transmit filters and/or receive filters.

Figure 15:
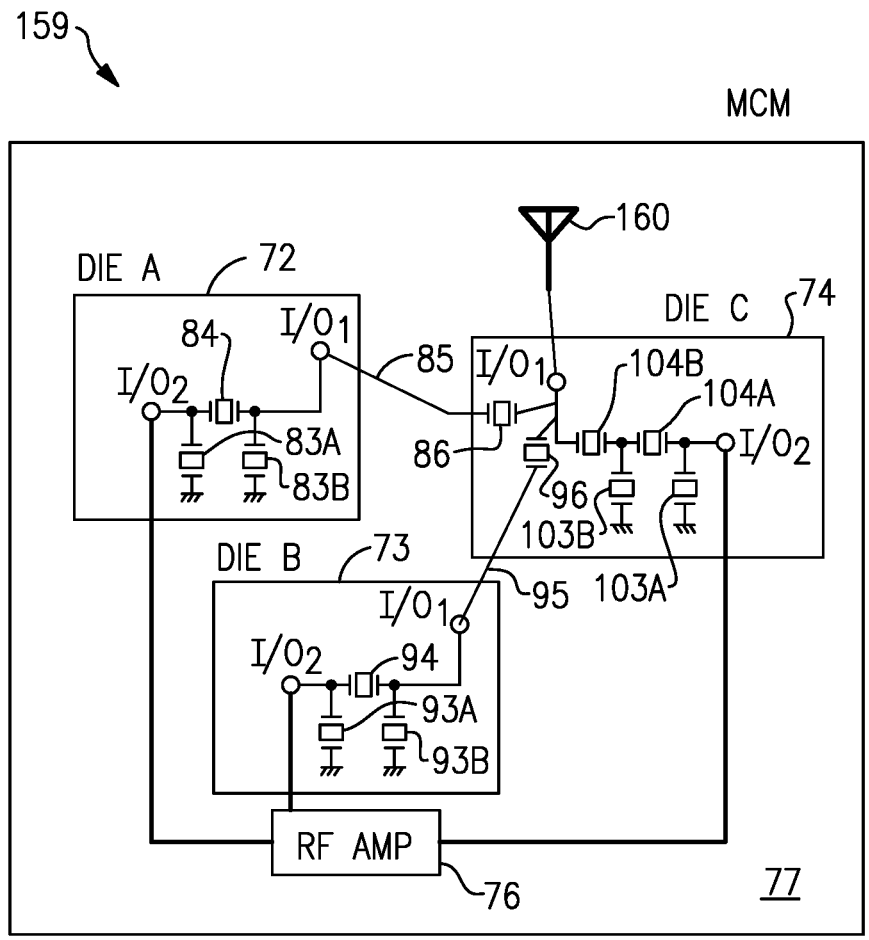
FIG. 15 is schematic diagram of a multi-chip module that includes a multiplexer directly electrically connected to an antenna according to an embodiment.

FIG. 15 is schematic diagram of a multi-chip module 159 that includes a multiplexer directly electrically connected to an antenna 160 according to an embodiment. As shown in FIG. 15, a multiplexer can be electrically connected to the antenna 160 without an intervening switch. The antenna 160 can be integrated in the multi-chip module 159 in certain applications. The antenna 160 can be external to the multi-chip module 159 in some other applications.

Figure 16:
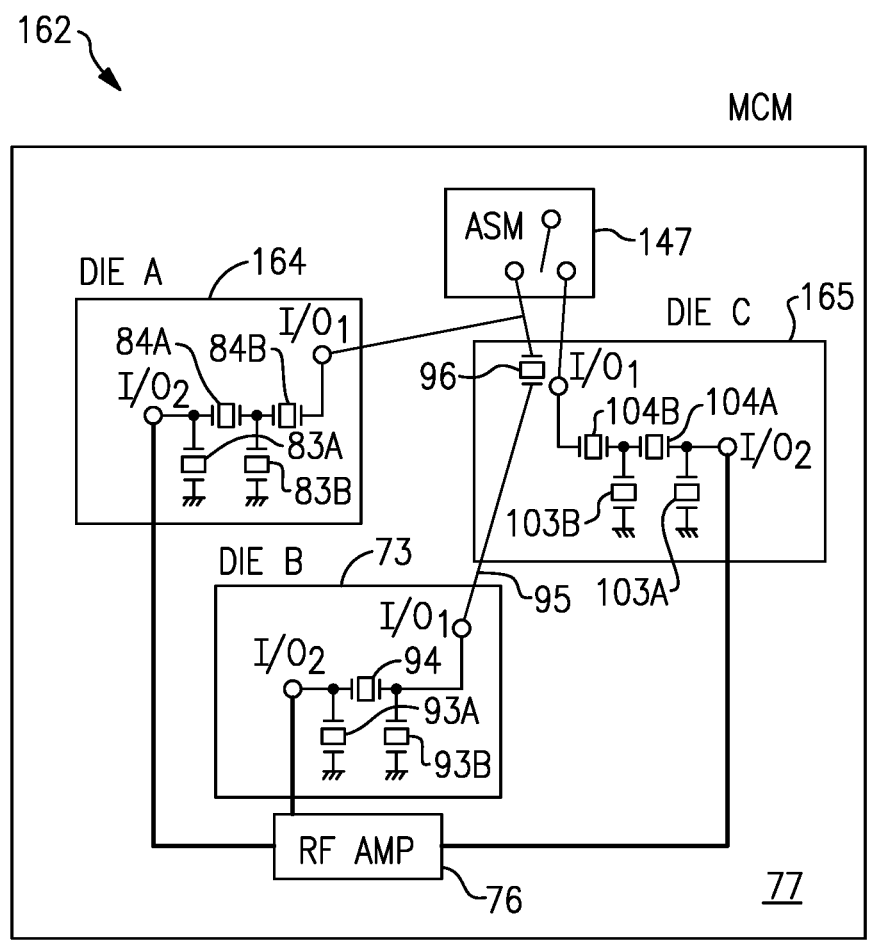
FIG. 16 is schematic diagram of a multi-chip module that includes a multiplexer with one acoustic wave filter having resonators on a plurality of die according to an embodiment.

FIG. 16 is schematic diagram of a multi-chip module 162 that includes a multiplexer with one acoustic wave filter having resonators on a plurality of die according to an embodiment. A subset of filters of a multiplexer can include front end resonators on a common acoustic resonator die. For example, in the multi-chip module 162, a second filter and a third filter of a multiplexer can each include one or more acoustic resonators on a second acoustic resonator die 165. One or more filters of a multiplexer can include acoustic resonators on a single die that does not include an acoustic resonator of another filter of the multiplexer. For example, in the multi-chip module 162, a first filter of a multiplexer include acoustic resonators 83A, 83B, 84A, and 84B on a first acoustic resonator die 164. The second and third filters of the multiplexer of the multi-chip module 162 do not include an acoustic resonator on the first acoustic resonator die 164. The second filter includes acoustic resonators 93A, 93B, and 94 on the third acoustic resonator die 73 and acoustic resonator 96 on the second resonator die 165. The acoustic resonator 96 is electrically connected to the other acoustic resonators 93A, 93B, and 94 of the second filter via transmission line 95. The first filter and the second filter can be electrically connected to each other external to the first acoustic resonator die 164 and second resonator die 165 and both electrically connected to the same port of the antenna switch module 147.

Figure 17:
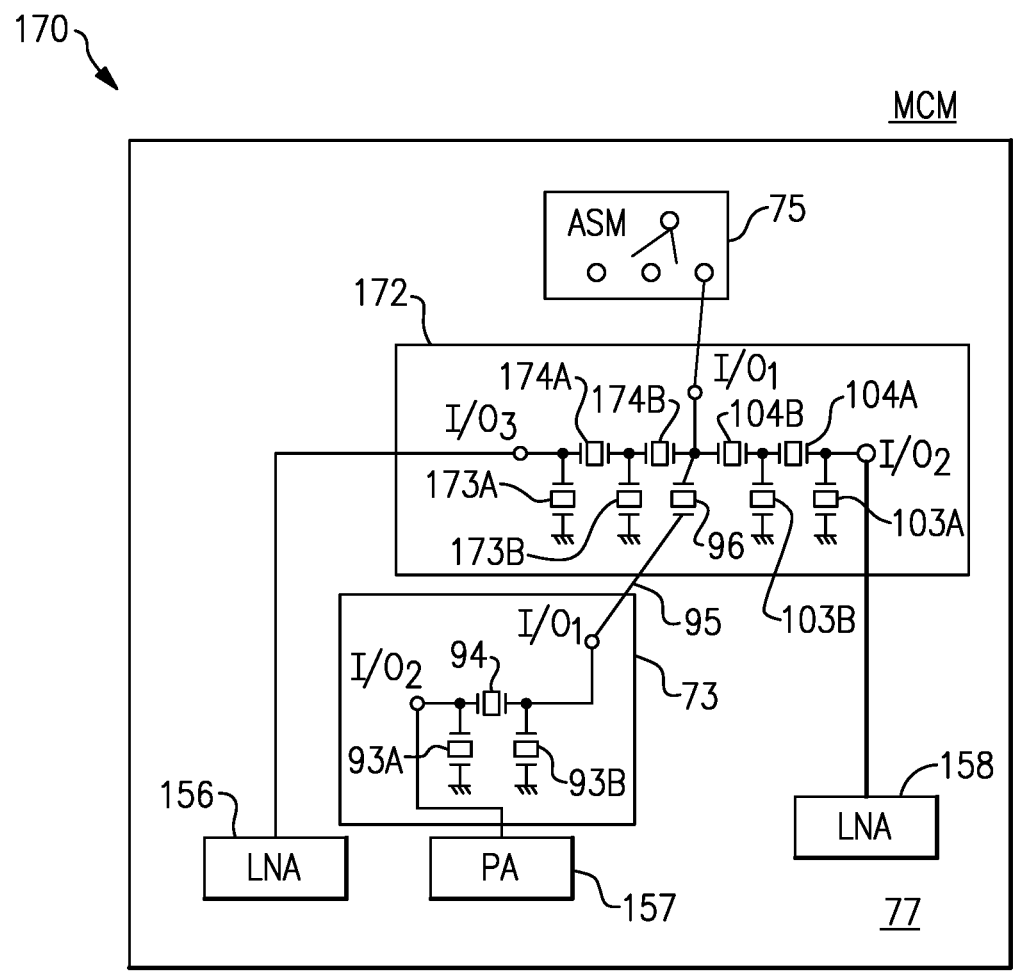
FIG. 17 is schematic diagram of a multi-chip module that includes a multiplexer with an acoustic wave filter having resonators on two die and two other acoustic wave filters having resonators on one of the two die according to an embodiment.

FIG. 17 is schematic diagram of a multi-chip module 170 that includes a multiplexer with an acoustic wave filter having resonators on two die and two other acoustic wave filters having resonators on one of the two die according to an embodiment. A plurality of filters can be implemented on a common acoustic resonator die. The common acoustic resonator die can also include a front end acoustic resonator of another filter. For example, in the multi-chip module 170, a first filter of a multiplexer can include a front end acoustic resonator 96 on an acoustic resonator die 172 and two other filters of the multiplexer can each include a plurality of acoustic resonators on the acoustic resonator die 172. One of the two other filters can include acoustic resonators 103A, 103B, 104A, and 104B on the acoustic resonator die 172. The other of the two other filters can include acoustic resonators 173A, 173B, 174A, and 174B on the acoustic resonator die 172. As illustrated in FIG. 17, all acoustic resonators of each of the two other filters can be on the acoustic resonator die 172.

The multiplexer of the multi-chip mode 170 is coupled to an antenna port of the multi-chip module 170 by way of an antenna switch module 75. In some other embodiments, the multiplexer can be electrically connected to an antenna port without an intervening switch.

In certain instances, the acoustic resonator die 172 can be a SAW die and the acoustic resonator die 73 can be a BAW die. In some such instances, the acoustic resonator die 172 can be a TCSAW die. A filter with acoustic resonators on the acoustic resonators on the acoustic resonator die 73 and a TCSAW resonator on the acoustic resonator die 172 can implement an acoustic filter with advantages of a BAW filter and reduced non-linear distortion from the front end TCSAW resonator.

As illustrated, the multi-die filter that includes acoustic resonators 93A, 93B, 94, and 96 is a transmit filter arranged to filter a radio frequency signal generated by the power amplifier 157.

Figure 18:
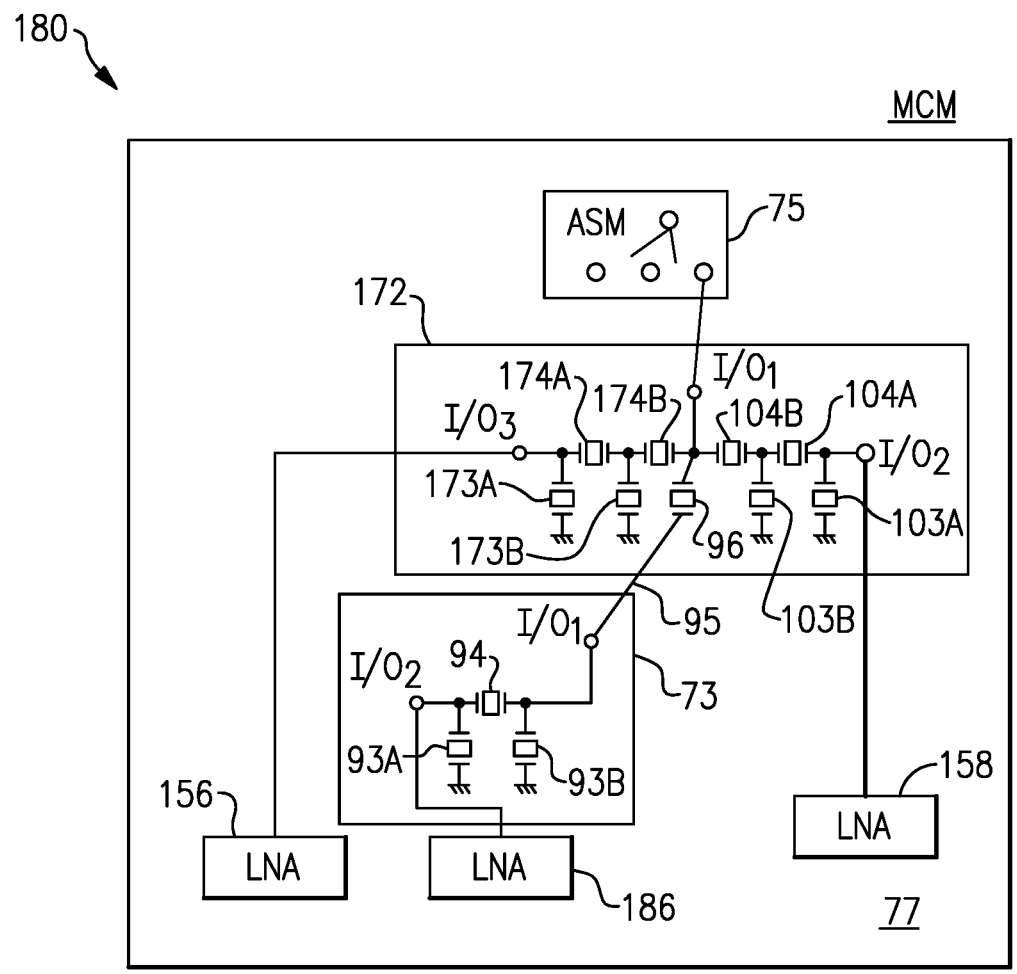
FIG. 18 is a schematic diagram of a multi-chip module that includes a multiplexer with an acoustic wave filter having resonators on two die and two other acoustic wave filters having resonators on one of the two die according to another embodiment.

FIG. 18 is schematic diagram of a multi-chip module 180 that includes a multiplexer with an acoustic wave filter having resonators on two die and two other acoustic wave filters having resonators on one of the two die according to another embodiment. The multi-chip module 180 is like the multi-chip module 170 of FIG. 17, except that all of the illustrated filers of a multiplexer of the multi-chip module 180 are receive filters and a low noise amplifier 186 is included in place of the power amplifier 157. In the multi-chip module 180, the multi-die filter that includes the acoustic resonators 93A, 93B, 94, and 96 is a receive filter. Any suitable principles and advantages disclosed herein can be implemented in connection with receive filters and/or transmit filters.

Figure 19:
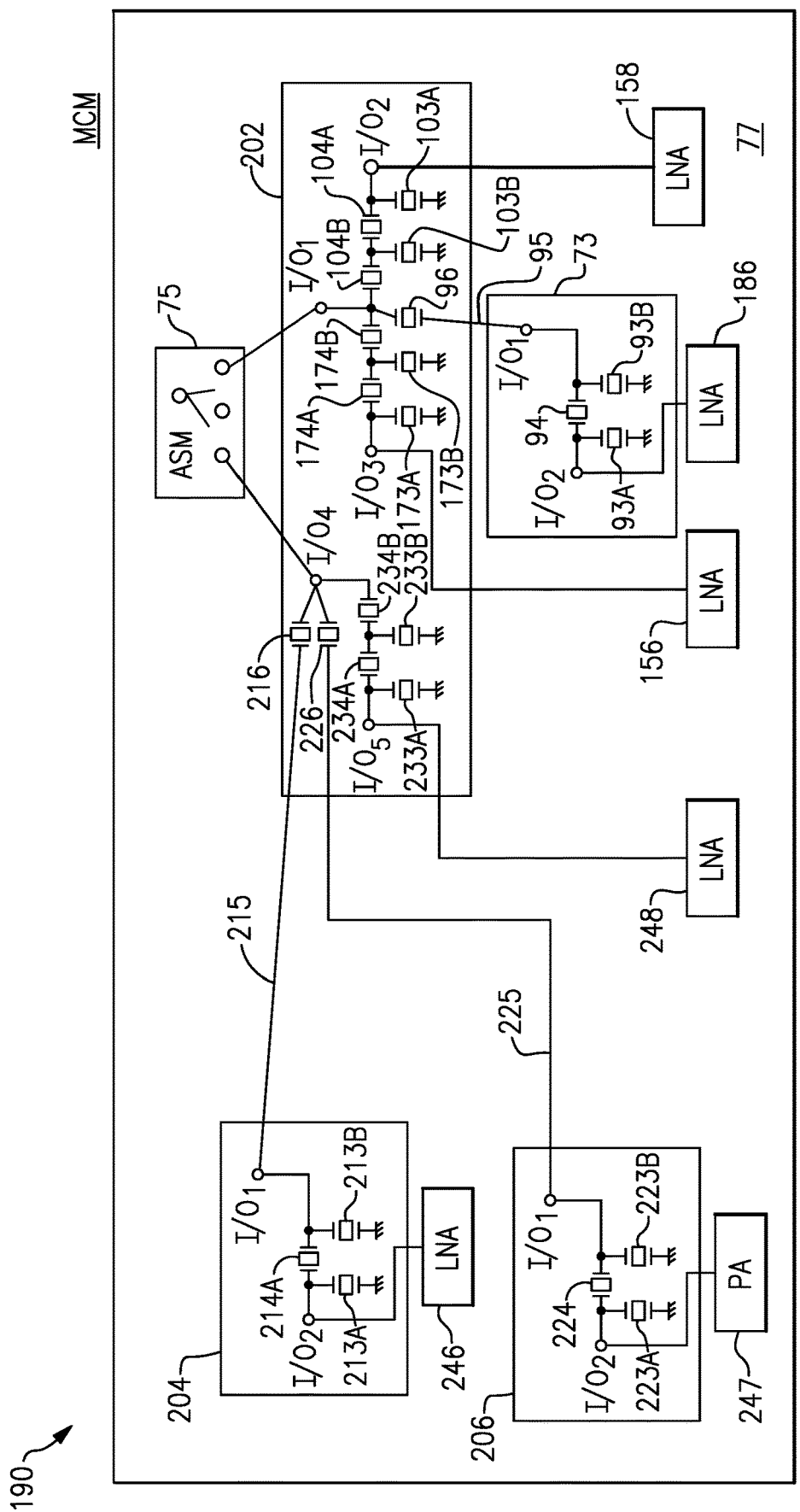
FIG. 19 is schematic diagram of a multi-chip module that includes a die with acoustic resonators of filters of different multiplexers according to an embodiment.

FIG. 19 is schematic diagram of a multi-chip module 190 that includes a die with acoustic resonators of filters of different multiplexers according to an embodiment. Acoustic resonators from filters of different multiplexers can be implemented on a common acoustic resonator die. The common acoustic resonator die can include acoustic resonators from filters of two or more different multiplexers. Any suitable principles and advantages of the other embodiments disclosed herein can be implemented in association with an acoustic resonator die that includes acoustic resonators of filters of two or more multiplexers.

The first multiplexer can be as described with reference to FIGS. 17 and/or 18. The multi-chip module 190 includes two additional acoustic resonator die 204 and 206 for filters of the second multiplexer. The second multiplexer includes three filters in the multi-chip module 190. The principles and advantages of the second multiplexer of FIG. 19 can be applied to any suitable multiplexer with a different number of filters. As illustrated in FIG. 19, an acoustic resonator die 202 of the multi-chip module 190 includes acoustic resonators of a first multiplexer and a second multiplexer. The acoustic resonator die 202 can include a front end resonator of each filter of the second multiplexer as illustrated. In FIG. 19, the acoustic resonator die 202 also includes a front end resonator of each filter of the first multiplexer.

A first filter of the second multiplexer includes acoustic resonators 213A, 2138, 214 on the acoustic resonator die 204, an acoustic resonator 216 on the acoustic resonator die 202, and a transmission line 215 electrically connecting the acoustic resonator 216 and the acoustic resonators 213A, 213B, and 214. The first filter can be a receive filter configured to provide a filtered radio frequency signal to the low noise amplifier 246. The low noise amplifier 246 can be implemented on the same die or a different die than one or more of the other low noise amplifiers of the multi-chip module 190.

A second filter of the second multiplexer includes acoustic resonators 223A, 223B, 224 on the acoustic resonator die 206, an acoustic resonator 226 on the acoustic resonator die 202, and a transmission line 225 electrically connecting the acoustic resonator 226 and the acoustic resonators 223A, 223B, and 224. The second filter can be a transmit filter configured to filter a radio frequency signal generated by a power amplifier 247. The power amplifier 247 can be implemented on different die than the low noise amplifiers of the multi-chip module 190.

The third filter of the second multiplexer includes acoustic resonators 233A, 233B, 234A, and 234B. All acoustic resonators of the third filter can be on the acoustic resonator die 202 as illustrated. The third filter can be a receive filter configured to provide a filtered radio frequency signal to the low noise amplifier 248. The low noise amplifier 248 can be implemented on the same die or a different die than one or more of the other low noise amplifiers of the multi-chip module 190.

The acoustic resonator die 202 includes input/output ports for the second multiplexer. A fourth input/output port I/O$_4$ port can be a port for electrically connecting a common node of the second multiplexer to the antenna switch module 75. A fifth input/output port I/O$_5$ port can be an output port for electrically connecting to the third filter of the second multiplexer to the low noise amplifier 248.

The antenna switch module 75 can selectively electrically connect one or more of the first multiplexer, the second multiplexer, and/or another signal path to an antenna port of the multi-chip module 190.

Figure 20:
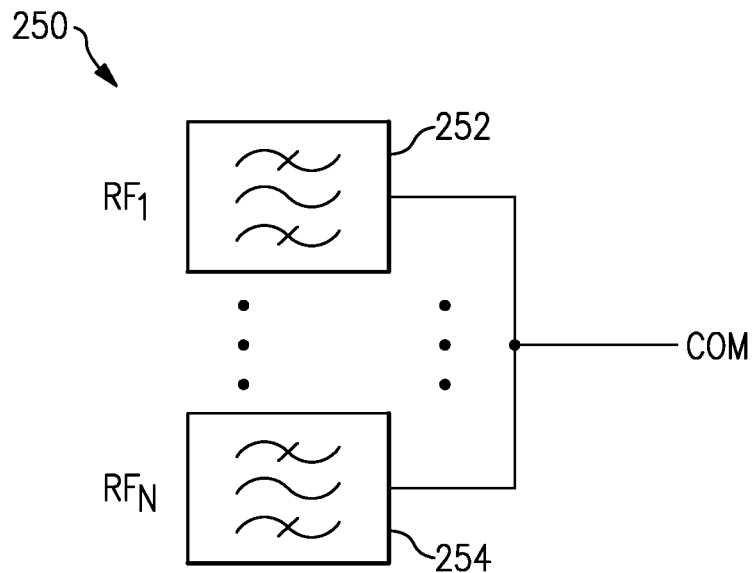
FIG. 20 is schematic diagram of a multiplexer with filters electrically connected to a common node without an intervening switch according to an embodiment.

FIG. 20 is schematic diagram of a multiplexer 250 with filters 252 and 254 electrically connected to a common node COM without an intervening switch according to an embodiment. The multiplexer 250 includes two or more filters coupled to each other at the common node COM. Any suitable number of filters that is two or more can be implemented in the multiplexer 250. Any suitable principles and advantages disclosed herein can be implemented in a multiplexer without a switch coupled between one or more filters of the multiplexer and the common node.

Figure 21:
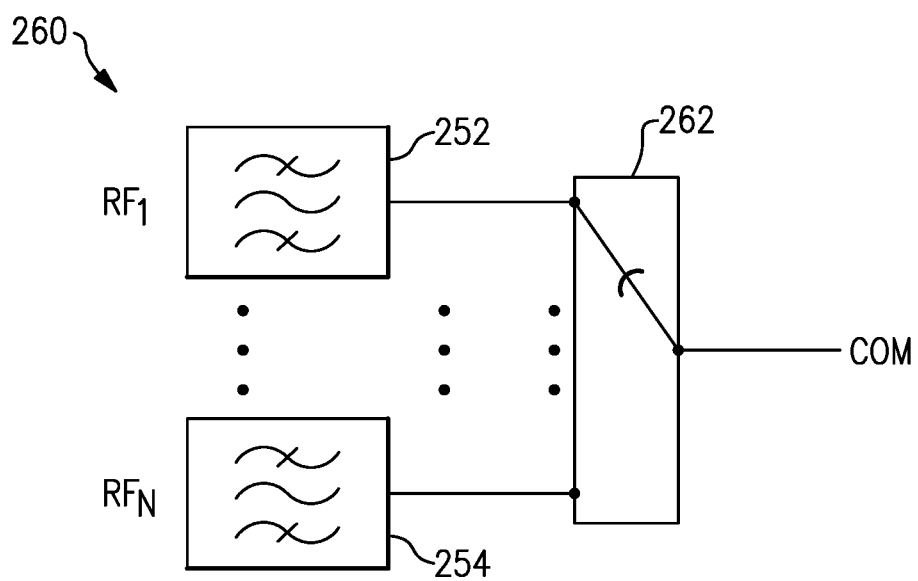
FIG. 21 is schematic diagram of a multiplexer with filters electrically connected to a common node via a switch according to an embodiment.

FIG. 21 is schematic diagram of a multiplexer 260 with filters 252 and 254 electrically connected to a common node COM via a switch 262 according to an embodiment. The switch 262 can selectively electrically connect one or more filters of the multiplexer 260 to the common node COM. In some instances, the switch 262 can selectively electrically connected two or more filters to the common node COM in certain states. Any suitable number of filters that is two or more can be implemented in the multiplexer 260. Any suitable principles and advantages disclosed herein can be implemented in a multiplexer with a switch coupled between one or more filters of the multiplexer and the common node.

Figure 22:
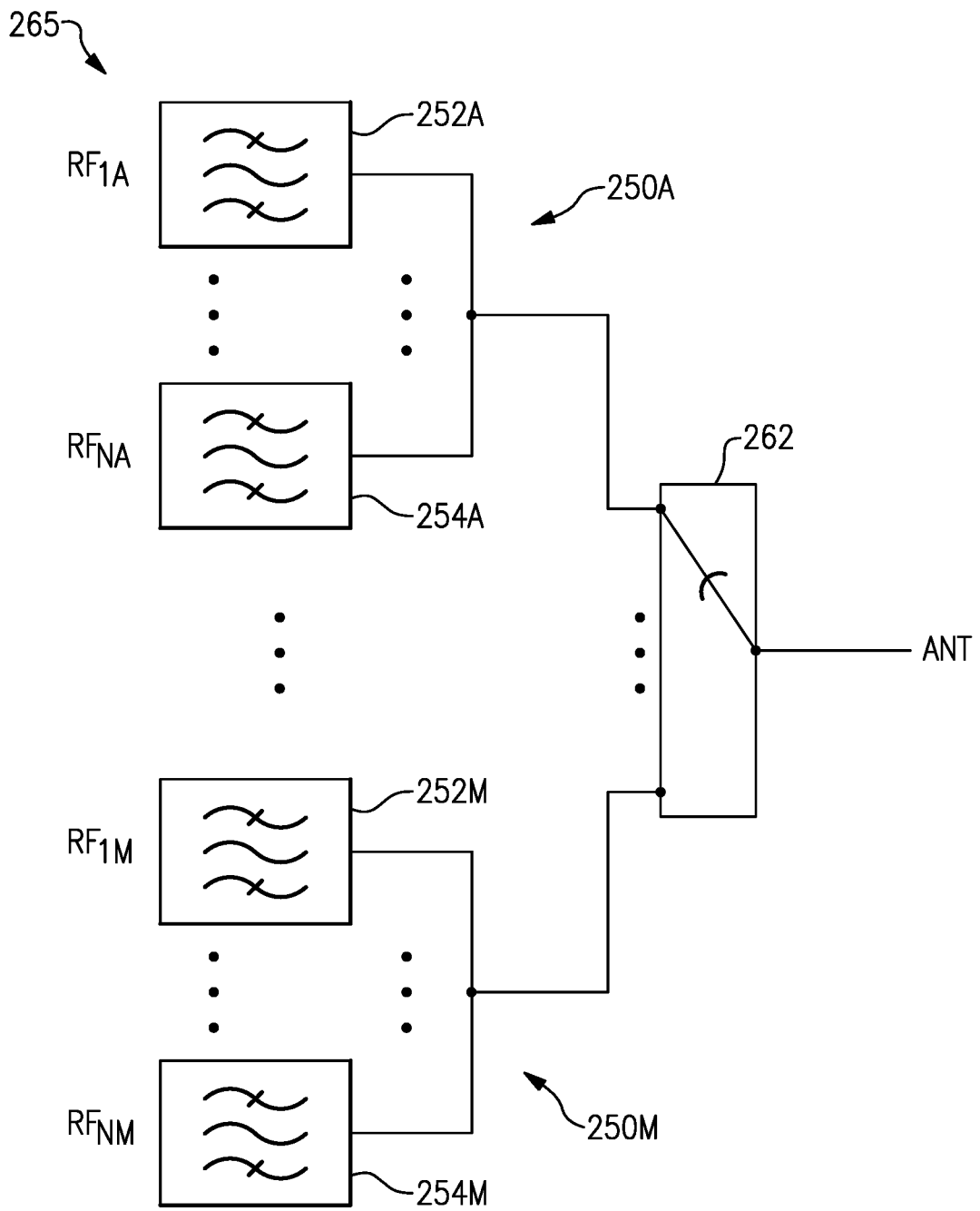
FIG. 22 is schematic diagram of a plurality of multiplexers electrically connected to an antenna node via a switch according to an embodiment.

FIG. 22 is schematic diagram of a radio frequency system 265 with a plurality of multiplexers 250A to 250M electrically connected to an antenna node via a switch 262 according to an embodiment. Each multiplexer 250A to 250M includes two or more filters coupled to each other at the common node COM. The multiplexer 250A includes filters 252A and 254A. The multiplexer 250N includes filters 252N and 254N. Any suitable number of filters that is two or more can be implemented in each multiplexer. A multiplexer of the radio frequency system 265 can include the same or a different number of filters than one or more other multiplexers of the radio frequency system 265. The switch 262 can selectively electrically connect one or more filters of the multiplexers 250A to 250M to an antenna node ANT. Any suitable principles and advantages disclosed herein can be implemented in one or more of the multiplexers 250A to 250M. Any suitable principles and advantages associated with the multi-chip module 190 of FIG. 19 can be implemented for two or more of the multiplexers 250A to 250M.

Figure 23:
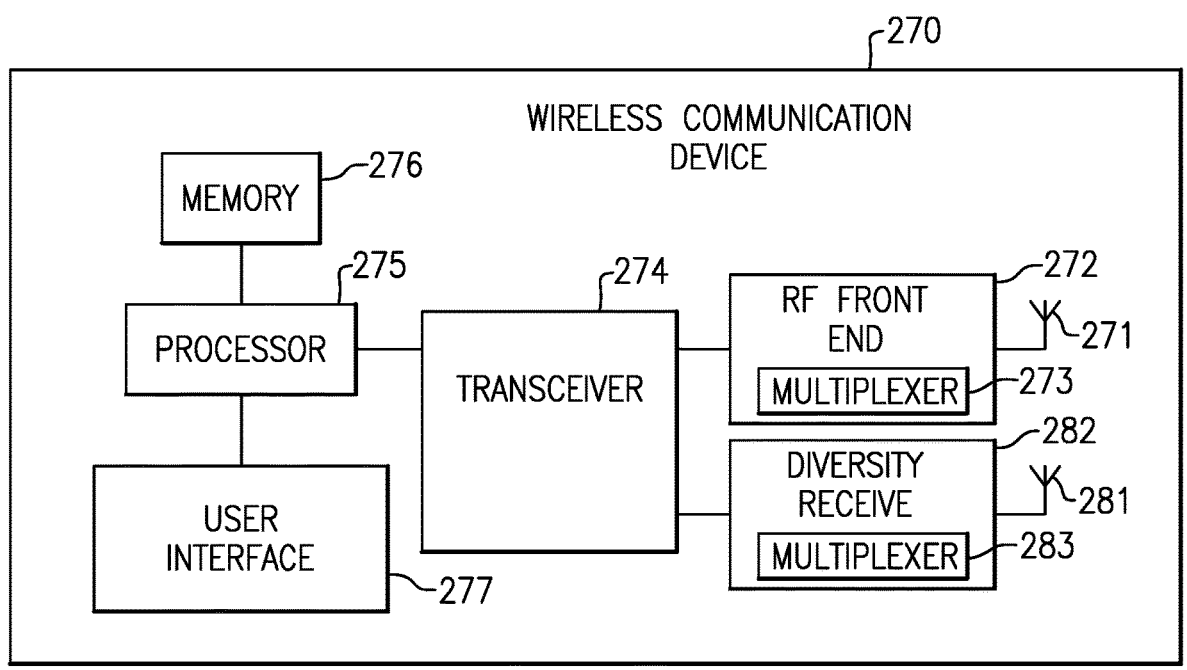
FIG. 23 is a schematic block diagram of a wireless communication device that includes a multiplexer according to an embodiment.

The multiplexers disclosed herein can be implemented in a variety of wireless communication devices. FIG. 23 is a schematic diagram of a wireless communication 270 device that includes a multiplexer 273 in a radio frequency front end 272 and a multiplexer 283 in a diversity receive module 282 according to an embodiment. The multiplexer 273 and/or the multiplexer 283 can be implemented in accordance with any suitable principles and advantages disclosed herein. The wireless communication device 270 can be any suitable wireless communication device. For instance, a wireless communication device 270 can be a mobile phone, such as a smart phone. As illustrated, the wireless communication device 270 includes a primary antenna 271, an RF front end 272, a transceiver 274, a processor 275, a memory 276, a user interface 277, a diversity antenna 281, and a diversity receive module 282.

The antenna 271 can transmit RF signals provided by the RF front end 272. Such RF signals can include carrier aggregation signals. The antenna 271 can receive RF signals and provide the received RF signals to the RF front end 272 for processing. Such RF signals can include carrier aggregation signals. The wireless communication device 270 can include any suitable number of antennas.

The RF front end 272 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 272 can transmit and receive RF signals associated with any suitable communication standards. The multiplexer 273 can include an acoustic wave filter with a transmission line between acoustic resonators on a plurality of different die, in which the multiplexer 273 includes any suitable combination of features of the embodiments disclosed above.

The transceiver 274 can provide RF signals to the RF front end 272 for amplification and/or other processing. The transceiver 274 can also process an RF signal provided by a low noise amplifier of the RF front end 272. The transceiver 274 is in communication with the processor 275. The processor 275 can be a baseband processor. The processor 275 can provide any suitable base band processing functions for the wireless communication device 270. The memory 276 can be accessed by the processor 275. The memory 276 can store any suitable data for the wireless communication device 270. The user interface 277 can be any suitable user interface, such as a display with touch screen capabilities.

The diversity module 282 is configured to process signals received by the diversity antenna 281. The transceiver 274 is in communication with both the radio frequency front end 272 and the diversity receive module 282. The multiplexer 283 can include any suitable combination of features of the multiplexers disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz. Acoustic wave filters disclosed herein can filter RF signals in fifth generation (5G) New Radio (NR) operating bands within Frequency Range 1 (FR1). FR1 can be from 410 MHz to 7.125 GHz, for example.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A multiplexer for filtering radio frequency signals, the multiplexer comprising:
   a first acoustic wave filter having a pass band;
   a second acoustic wave filter coupled to the first acoustic wave filter at a common node, the second acoustic wave filter including a first acoustic resonator on a first die and a second acoustic resonator on a second die, the second acoustic resonator having a high impedance at the pass band of the first acoustic wave filter, the second acoustic resonator being electrically connected to the first acoustic resonator via a transmission line, and the first acoustic resonator being a same type of acoustic resonator as the second acoustic resonator; and
   a third acoustic resonator on the second die, and the third acoustic resonator is a shunt resonator.

2. The multiplexer of claim 1 wherein the first acoustic resonator is a surface acoustic wave resonator.

3. The multiplexer of claim 2 wherein the second acoustic resonator is a surface acoustic wave resonator.

4. The multiplexer of claim 1 wherein the first acoustic resonator is a bulk acoustic wave resonator.

5. The multiplexer of claim 4 wherein the second acoustic resonator is a bulk acoustic wave resonator.

6. The multiplexer of claim 1 wherein the first acoustic wave filter includes a third acoustic resonator on the second die.

7. The multiplexer of claim 6 wherein the second acoustic resonator and the third acoustic resonator are electrically connected to each other on the second die.

8. The multiplexer of claim 1 further comprising a switch coupled between the first acoustic wave filter and the common node, the switch also being coupled between the second acoustic wave filter and the common node.

9. The multiplexer of claim 1 wherein the first acoustic wave filter is coupled to the common node without an intervening switch.

10. The multiplexer of claim 1 wherein the common node is on the second die.

11. The multiplexer of claim 1 wherein the first acoustic resonator is a series resonator.

12. The multiplexer of claim 11 wherein the second acoustic resonator is a series resonator.

13. The multiplexer of claim 1 wherein the first acoustic resonator is a shunt resonator.

14. The multiplexer of claim 13 wherein the second acoustic resonator is a shunt resonator.

15. The multiplexer of claim 1 further comprising a switch coupled between the second acoustic resonator and the common node.

16. The multiplexer of claim 1 wherein all acoustic resonators of the second acoustic wave filter are on the second die.

17. A multiplexer for filtering radio frequency signals, the multiplexer comprising:
   a first acoustic wave filter having a pass band;
   a second acoustic wave filter coupled to the first acoustic wave filter at a common node, the second acoustic wave filter including a first acoustic resonator on a first die and a second acoustic resonator on a second die, the second acoustic resonator having a high impedance at the pass band of the first acoustic wave filter, the second acoustic resonator being electrically connected to the first acoustic resonator via a transmission line, the first acoustic resonator being a same type of acoustic resonator as the second acoustic resonator, and the first acoustic wave filter further includes a third acoustic resonator on the second die and a fourth acoustic resonator on a third die, the third acoustic resonator coupled to the fourth acoustic resonator via a second transmission line.

18. A multiplexer for filtering radio frequency signals, the multiplexer comprising:

a first acoustic wave filter having a pass band;

a second acoustic wave filter coupled to the first acoustic wave filter at a common node, the second acoustic wave filter including a first acoustic resonator on a first die and a second acoustic resonator on a second die, the second acoustic resonator having a high impedance at the pass band of the first acoustic wave filter, the second acoustic resonator being electrically connected to the first acoustic resonator via a transmission line, and the first acoustic resonator being a same type of acoustic resonator as the second acoustic resonator; and an additional acoustic wave filter coupled to the common node, the additional acoustic wave filter including a third acoustic resonator on the second die.

19. The multiplexer of claim 18 wherein the additional acoustic wave filter further includes a fourth acoustic resonator on a third die, the third acoustic resonator coupled to the fourth acoustic resonator via a second transmission line.

20. The multiplexer of claim 18 wherein the first acoustic wave filter further includes a third acoustic resonator on the second die, and the third acoustic resonator is a shunt resonator.

* * * * *